United States Patent [19]

Geysen

[11] Patent Number: 5,469,000
[45] Date of Patent: Nov. 21, 1995

[54] SWITCHING DEVICE WITH A PLURALITY OF SWITCHES RESPONSIVE TO AN INPUT SIGNAL LEVEL

[76] Inventor: Hendrik M. Geysen, 31 Old Menzies Creek Road, Menzies Creek, Victoria 3159, Australia

[21] Appl. No.: 834,340

[22] PCT Filed: Aug. 10, 1990

[86] PCT No.: PCT/AU90/00343

§ 371 Date: Mar. 10, 1992

§ 102(e) Date: Mar. 10, 1992

[87] PCT Pub. No.: WO91/03103

PCT Pub. Date: Mar. 7, 1991

[30] Foreign Application Priority Data

Aug. 15, 1989 [AU] Australia ............... PJ5780/89
Dec. 22, 1989 [AU] Australia ............... PJ8005/89

[51] Int. Cl.⁶ ............................................. H02J 1/00
[52] U.S. Cl. ................................................... 307/39
[58] Field of Search .................. 307/36–41, 113, 307/115, 125, 126, 130; 361/166, 167, 168.1, 169.1, 187

[56] References Cited

U.S. PATENT DOCUMENTS

| 3,019,393 | 1/1962 | Rockafellow | 328/130.1 |
| 3,484,618 | 12/1969 | Beezley | 307/41 |
| 3,504,189 | 3/1970 | McHenry | 307/41 |
| 3,521,130 | 7/1970 | Davis et al. | 307/41 X |
| 3,723,827 | 3/1973 | Griswold et al. | 307/38 X |
| 3,736,438 | 5/1973 | Matty et al. | 307/130 |
| 3,796,924 | 3/1974 | Fontana | 361/169.1 |
| 3,846,641 | 11/1974 | Eguchi | 307/41 |
| 3,979,648 | 9/1976 | Toyoshima et al. | 307/41 X |
| 4,241,375 | 12/1980 | Ruggles | 307/41 X |

*Primary Examiner*—A. D. Pellinen
*Assistant Examiner*—Fritz M. Fleming
*Attorney, Agent, or Firm*—Blakely, Sokoloff, Taylor & Zafman

[57] ABSTRACT

A switching device (2) comprises a plurality of switching means (4) connected in series by input conductor (12) to an input terminal (8). A plurality of respective load means (6) are connected between the switching means (4) and an output terminal (10). Each of the switching means (4) is adapted to selectively activate the respective load means (6) by connecting it to the input terminal (8) in response to a corresponding voltage level applied to the input terminal (8).

33 Claims, 13 Drawing Sheets

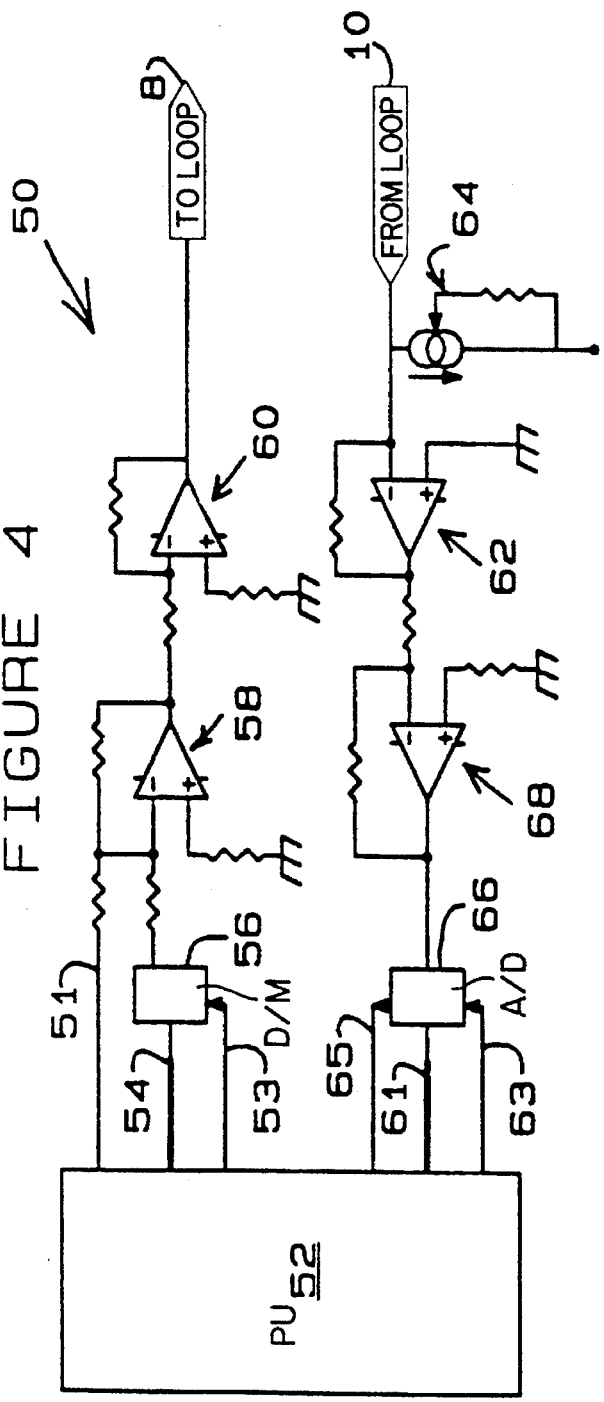
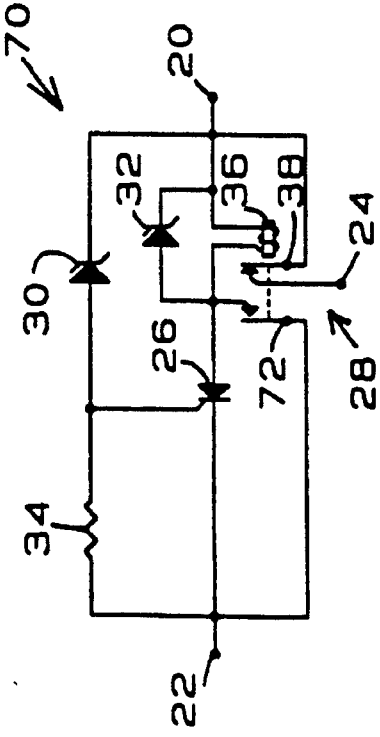

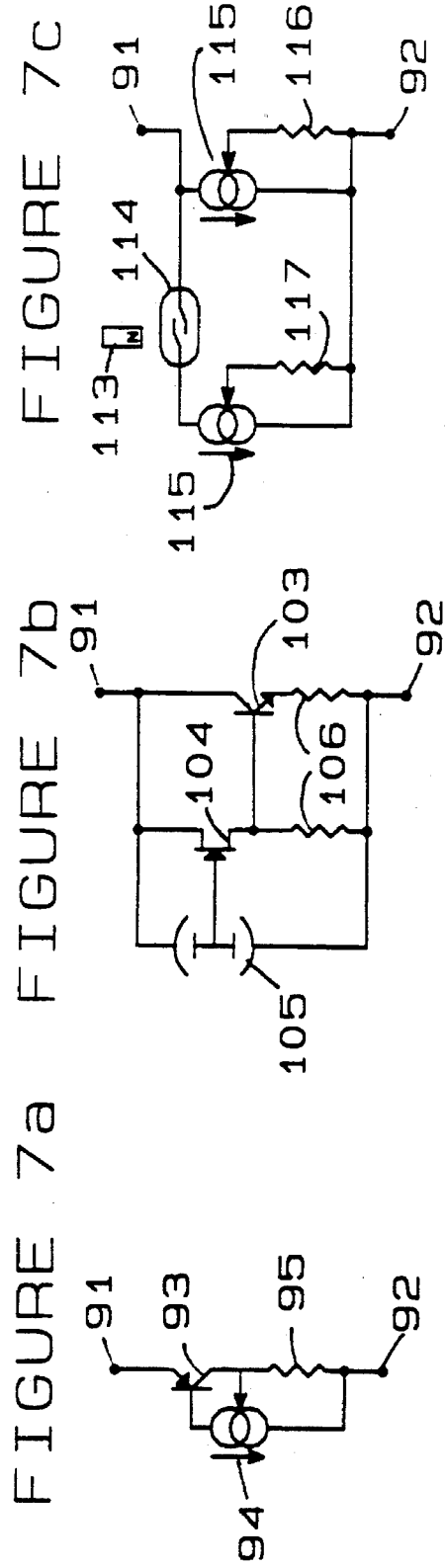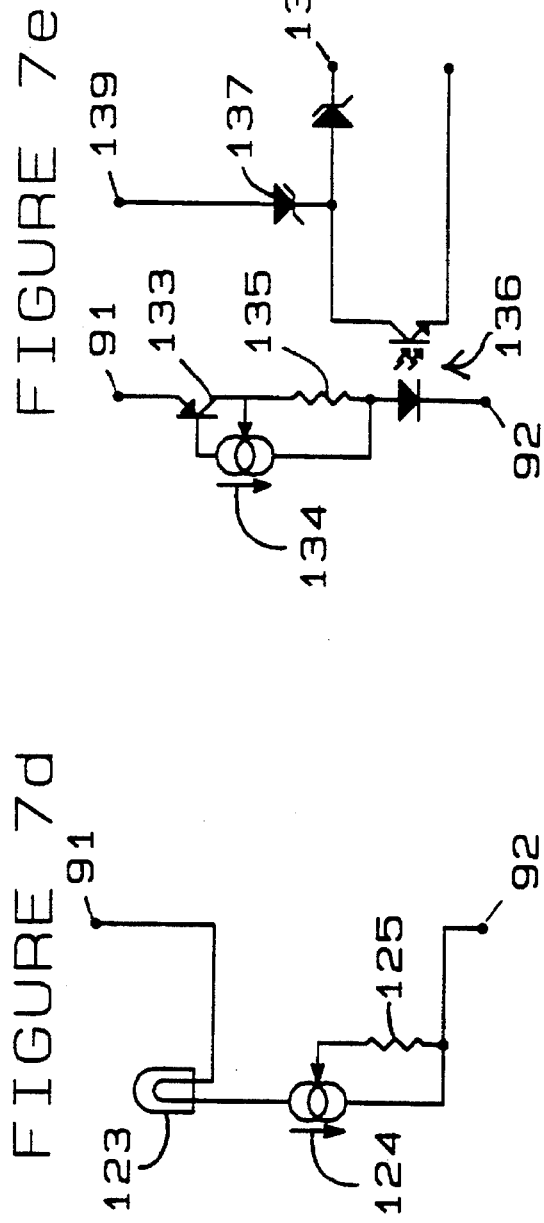

loop voltage

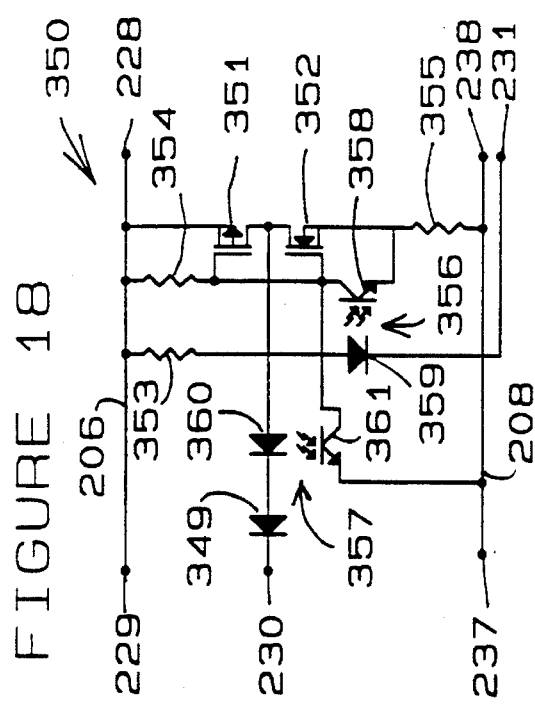

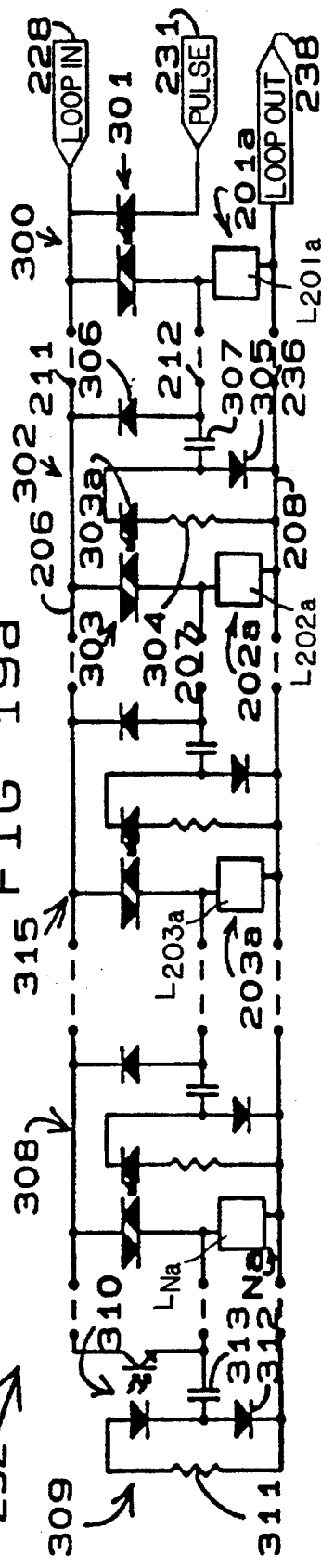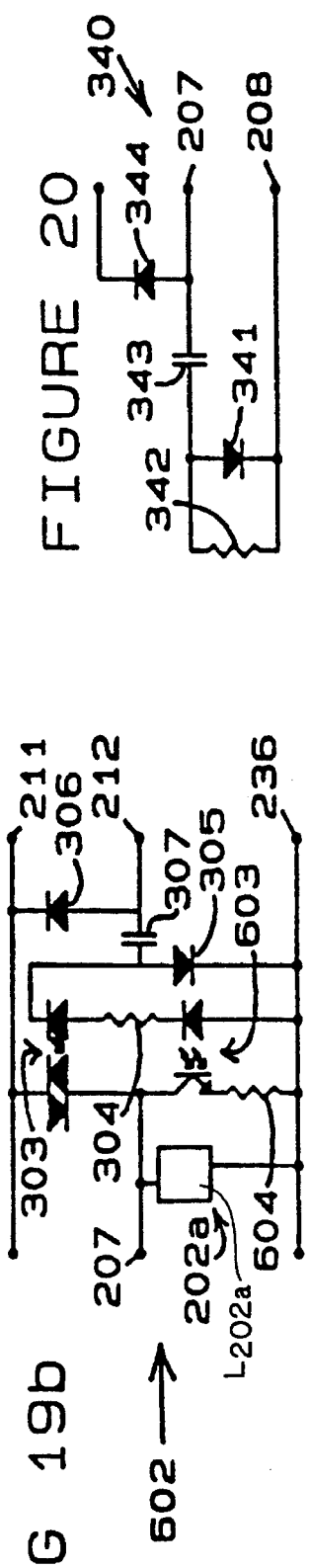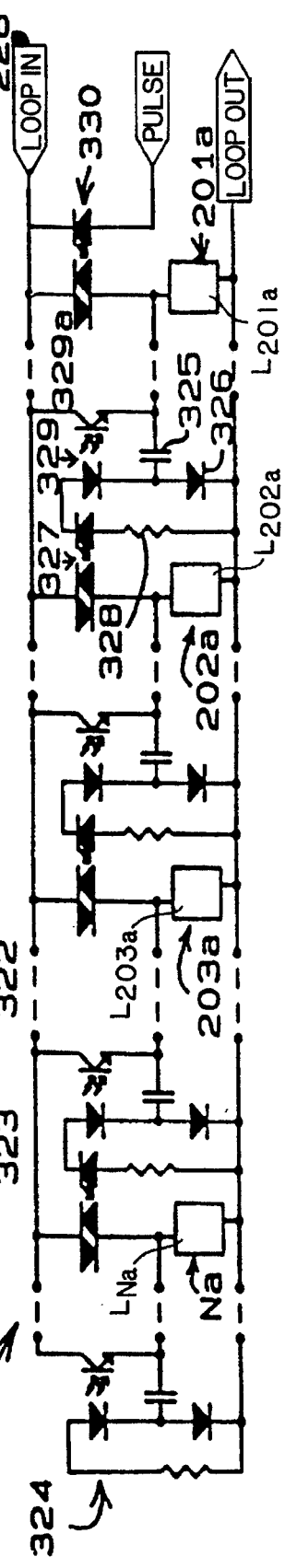

Time periods during which reading of loop current is valid

SWITCHING DEVICE WITH A PLURALITY OF SWITCHES RESPONSIVE TO AN INPUT SIGNAL LEVEL

BACKGROUND OF THE INVENTION

The present invention relates to a switching device for selectively switching a plurality of loads, a method of selectively switching a plurality of loads and a switching unit for use in the switching device and method.

It is a common requirement in many situations to conduct measurements of physical properties at locations remote from the site where such measurements are collated and actions taken. Examples include plant processes where, for example, the temperature, pH and pressures of various reactors need to be monitored; and security installations where many doors and windows need to be continually monitored to determine whether or not they are open or closed. In many of these situations, it is necessary to trigger a particular action to occur at a remote site depending on the values or status of the parameters being measured.

Apparatuses which detect the occurrence, position or value of an event, or which cause a particular action to be taken consist of three parts:

1. Transducer/transmitter. This is the component of the system which detects the parameter being measured, converts the information into a signal, such as an electrical signal, and transmits this signal to a central location for further processing.

2. Transmission medium. In many instances this is may be simply a single pair of electrical conductors. However, in some instances the transmission medium could be as complex as a signal coded into an electromagnetic carrier such as a radio signal or a light beam. In some specialized cases, such as areas with explosive mixtures of gases, the transmission medium may not be electrical and may be, for example, pneumatic, or, optical.

3. Receiver. This is the component of the system where the signal is received and processed. The value of the parameter being measured could be displayed or could initiate a particular action or both.

Many combinations of individual variants of these components can be put together to make a workable system to achieve the desired result.

At present, it is understood that any working system is a compromise between the complexity and cost of these three components. As a general principle, the simpler the transmission medium, the more complex will be the transmitter and receiver, and vice versa. For example, if there are 50 locations at which it is desired to record the temperature, to use a single pair of conductors as the transmission medium requires extensive coding/decoding at both ends. Alternatively, utilizing simple detectors and indicators, to monitor the same 50 locations would require 50+1 (common) conductors.

Thus it would be desirable to provide a device and a method whereby many transducers at remote sites could be monitored in a simple fashion via a minimal number of conductors. The same principle can also applied to cause desired actions to be effected at remote sites.

SUMMARY OF THE INVENTION

Broadly, the present invention provides a switching device in which a plurality of switching means are connected to an input terminal, a plurality of respective load means are connected to said switching means, and each of said switching means is adapted to activate the respective load means in response to a corresponding input signal at said input terminal.

In accordance with one aspect of the present invention there is provided a switching device in which a plurality of switching means are connected in series to an input terminal, a plurality of respective load means are connected to said switching means, and each of said switching means is adapted to selectively activate the respective load means in response to the level of an input signal at said input terminal.

The invention relies on the realization that a signal from the receiver component of the s stem can be used to cause only one of a plurality transducer/transmitter components, each of which is connected into a common loop, to respond. It is well known that the same results can be achieved by complex decoding by the transducer/transmitter component of the system. However, in a preferred embodiment of the invention the same result is achieved with a simple voltage trip to which only one of the transducer/transmitters responds. The preferred embodiment relies on using a voltage impressed on the loop to cause only one of the transducer/transmitters to respond, and then measuring the current generated in the loop. This current is modulated by the transducer depending on the value of the parameter being measured.

Whilst a switching device in accordance with the first aspect of the invention is advantageous in a number of respects, the number of units which can be connected in series and sequentially activated in the previous switching device is limited by the voltage level which can be applied to the input of the device, because the voltage required to activate the last switching unit in the device is directly proportional to the number of units in the device. Furthermore, when a particular switching unit is activated so as to supply power to a respective load unit, power is dissipated by the preceding switching units which must also be activated and this power is effectively wasted. Hence, it is desirable to provide a switching device which does not require all of the preceding switching units to be activated when a particular switching unit and corresponding load unit are activated.

Accordingly, in a second aspect, the invention provides a switching device in which a plurality of switching means are connected in series to an input terminal, a plurality of respective load means are connected to said switching means, and said switching means are placed either in an activated state or a deactivated state in response to a trigger signal applied thereto so as to activate or deactivate said respective load means, at least one of said switching means changing from one of said states to the other of said states upon application of said trigger signal.

BRIEF DESCRIPTION OF THE DRAWING

Preferred embodiments of the present invention will hereinafter be described, by way of example only, with reference to the accompanying drawings, wherein:

FIG. 4 is a circuit diagram of an interface for the switching device;

FIGS. 5 and 6 are respective circuit diagrams of second and third preferred embodiments of switching units of the switching device;

FIG. 7a to 7e, 8a and 8b are circuit diagrams of load units which may be included in the switching device;

FIG. 16 is a circuit diagram of a second preferred embodiment of a switching unit of the switching device;

FIG. 17 is a circuit diagram of a second preferred embodiment of the switching device;

FIG. 18 is a circuit diagram of an initiator unit for the switching units;

FIG. 19a is a circuit diagram of a further embodiment of a switching device which is edge-triggered as distinct from the voltage sensitive switching device of FIG. 12;

FIG. 19b is a circuit diagram of an alternative switching device for use in the switching device of FIG. 19a;

FIG. 20 is a circuit diagram of an alternative terminator unit for the switching units;

FIGS. 21a and 21b are respective waveform diagrams of voltage signals which are applied during operation of the switching device and a waveform diagram of the resulting voltage on a capacitor of the switching device of FIG. 19a;

FIG. 22 is a circuit diagram of a second embodiment of an edge-triggered switching device;

DETAILED DESCRIPTION OF THE INVENTION

Figure 1:
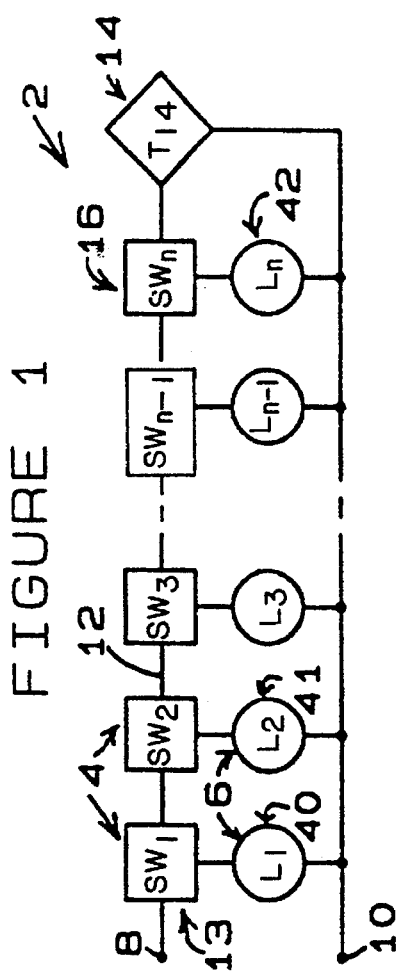
FIG. 1 is a block diagram of a first form of switching device according to the invention.

A first form of electrical switching device 2, as shown in FIG. 1, includes a plurality of switching units 4, a plurality of load units 6, and an input contact 8 and an output contact 10. The switching units 4 are connected in series with respect to one another and adjacent switching units 4 are connected by a single conducting wire 12. The load units 6 are connected in parallel with respect to the input and output contacts 8 and 10 and are connected to respective switching units 4. The load units 6 each include a single input and a single output and the inputs are connected to the respective switching units 4 and the outputs are all connected to the output contact 10. The input contact 8 is connected to the first switching unit 13 and an optional terminating unit 14 is connected between the last switching unit 16 and the output contact 10.

The switching units 4 are configured to selectively activate one of the load units 6 in response to the voltage present at the input contact 8. The output contact 10 is maintained at a low voltage and a switching unit 4 activates a corresponding load unit 6 by supplying a voltage to the load unit 6. The load units 6 may be sensors which provide a current representative of a sensed parameter or units which cause a predetermined action, such as switching on a light, when activated.

The level of the voltage at the input contact 8 determines which one of the switching units 4 will supply an activating voltage to its respective load unit. Only one of the switching units 4 is able to activate a respective load unit 6 at any given time. When the voltage across a switching unit 4 is at a first level an activating voltage is supplied to the respective load unit but when the voltage across the switching unit 4 reaches a second level voltage is passed directly to the next, or succeeding, switching unit 4 in the series and the previously activated load unit 6 is deactivated. The current which passes through the activated load unit 6 may be measured by interface circuitry connected to the output contact 10 or the input contact 8. When the voltage at the input contact 8 reaches a high level where none of the switching units 4 are in a state to activate a respective load unit 6, a voltage is applied to the terminating unit 14, which is configured to draw a current which indicates to the interface circuitry that the high level voltage has been reached.

Figure 2:
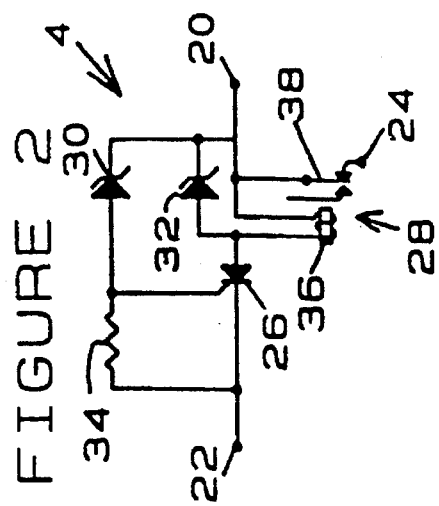
FIG. 2 is a circuit diagram of a first preferred embodiment of a switching unit for the first form of switching device.

A switching unit 4, as shown in FIG. 2, includes an input 20, a bypass output 22, a drive output 24, a silicon controlled rectifier (SCR) 26, a relay 28, two Zener diodes 30 and 32, and a resistor 34. The coil 36 of the relay 28 is connected between the input 20 and anode of the SCR 26 and the switch 38 of the relay 28 is connected between the input 20 and the drive output 24. The switch 38 is normally closed. The cathode of the SCR 26 is connected to the bypass output 22 and the resistor 34. The first Zener diode 30 has its anode connected to the resistor 34 and the gate, or trigger, input of the SCR 26, and has its cathode connected to the input 20. The second Zener diode 32 is connected across the coil 36 so as protect the switching unit 4 from back EMF when the coil 36 is de-energised and restricts the voltage drop across the coil 36 when it is energised. When the first level voltage is applied to the input 20, the voltage is applied directly to the drive output 24 so as to activate a load unit 6 connected thereto, as the relay 28 is de-energised. Increasing the voltage to the second level, by applying a suitable pulse, causes a breakdown voltage to appear across the first Zener diode 30. Due to the provision of the resistor 34, a trigger pulse is therefore applied to the gate input of the SCR 26 from the first Zener diode 30. This causes the SCR 26 to conduct and current is passed through the coil 36 so as to energise the relay 28 and open the switch 38. The load unit 6 connected to the drive output 24 is deactivated and voltage is supplied to the bypass output 22. As a voltage drop occurs across the coil 36 and the SCR 26, to apply the first level voltage to the succeeding switching unit 4 connected to the bypass output 22 the level of the voltage at the input 20 is stepped up to compensate for the voltage drop across the coil 36 and the SCR 26.

Figure 3:
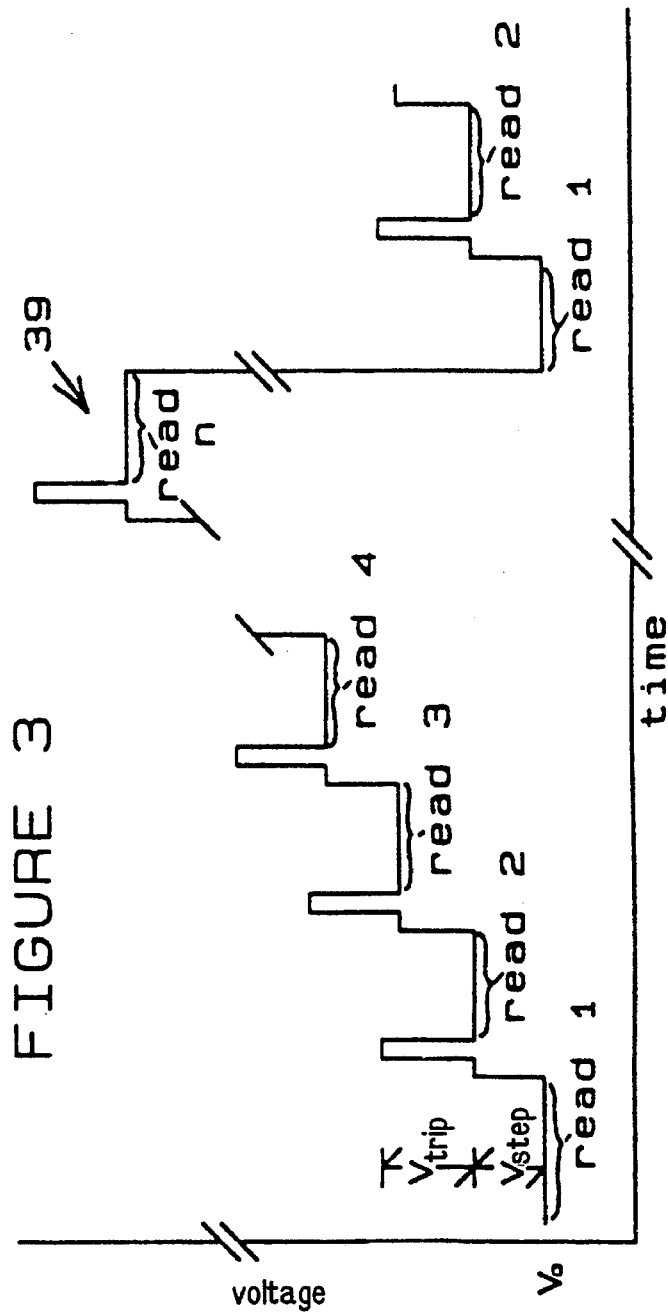
FIG. 3 is a waveform diagram of a voltage signal which may be used to control the switching device.

The voltage 39 which would be required to be inputted at the input contact 8 of the device 2 to successively activate the load units 6 from the first unit 40 to the last unit 42 is illustrated in FIG. 3. A voltage $V_o$ is required to activate the first load unit 40, or read the unit 40 if it is a parameter sensor. The parameter may be local temperature, pressure, smoke level, water level, etc. To activate or read the second load unit 41 and bypass the first switching unit 13 the voltage at the input contact 8 needs to be increased by $V_{step}$ and an additional voltage pulse $V_{trip}$ applied to trigger the SCR 26 of the first switching unit 13. Once the SCR 26 has been triggered the voltage $V_o$ plus $V_{step}$ is sufficient to keep the SCR 26 conducting. Thus, to activate the nth unit 42 requires an input voltage of $V_{trip}+(n-1)(V_{step})+V_0$, and to read the nth unit 42 requires an input voltage of $(n-1)(V_{step})+V_O$.

An interface 50, as shown in FIG. 4, may be used to drive the switching device 2 and receive a current signal from the selectively activated load units 6. The interface 50 includes a processing unit 52 which outputs data on a bus 54 to dictate which load unit 6 is activated. The data is converted to an analog signal by a D/A converter 56 and inputted to an inverting buffer 58. The D/A converter 56 receives a strobe signal from processing unit 52 on line 53. The processing unit 52 also generates the $V_{trip}$ pulse, as required, which is applied on line 51 to the inverting buffer 58 so as to be added to the analog signal. The output of the buffer 58 is amplified by an inverting amplifier 60 and applied to the input contact 8 of the switching device 2.

The output contact 10 is connected to the input of a current to voltage converter 62, which converts the current from the activated load unit 6 to a corresponding voltage. A zero set circuit 64 is also connected to the input of the converter 62 so as to ensure the current received at the input is zero when none of the load units 6 is activated. The output of the converter is applied to an A/D converter 66, via an inverting buffer 68 so as to convert the output signal to digital data which is inputted to the processing unit 52 through/or on bus 61 for analysis. The converter 66 receives a strobe signal from processing unit 52 on line 63. The converter 66 also delivers a status signal to the processing unit 52 on line 65 indicating completion of the conversion.

A second switching unit 70, as shown in FIG. 5, is the same as the first switching unit 4, illustrated in FIG. 2 except that the relay 28 includes two switches 38 and 72. The first switch 38 is normally closed and is connected between the input 20 and the drive output 24 and the second switch 72 is normally open and is connected across the SCR 26. When the coil 36 is energised the switch 72 is closed, and voltage is applied directly from the coil 36 to the bypass output 22. The inclusion of the second switch 22 avoids the voltage drop across the SCR when the coil 36 is energised. This enables more switching units 4 to be connected in series for a maximum operating voltage which can be applied to the input contact 8 of the switching device 2.

A third switching unit 74, as shown in FIG. 6, includes the SCR 26, resistor 34 and first Zener diode 30, as described for the previous switching units 4 and 70 but the relay circuitry is not included. Instead a transistor 76 is used to switch the respective load unit 6 on and off in response to activation of the SCR 26. The cathode of the first Zener diode 30 is connected to the anode of the SCR 26 and the drive output 24 is connected to the collector of the PNP transistor 76. The emitter of the transistor 76 is connected to the anode of a second Zener diode 78, which is used to provide a fixed voltage drop and has its cathode connected to the input 20 of the switching unit 74. The base of the transistor 76 is connected to the cathode of the SCR 26 and is provided with a bias current from a bias resistor 80 when the SCR 26 is not conducting. The bias resistor 80 is connected between the base and the low voltage output contact 10 of the switching device 2. The transistor 76 is forward biased and applies a voltage to the drive output 24 to active the respective load unit 6 when the SCR 26 is not conducting and is reverse biased once the SCR 26 begins conducting and thereby deactivates the respective load unit 6.

Although the switching units 4, 70 and 74 described above all employ an SCR any threshold switching component may be used instead. Suitable alternatives include silicon controlled switches (SCS), programmable unijunction transistors (PUT) and TRIACs.

FIGS. 7a to 7e, 8a and 8b give examples of practical realizations of the load units 6 illustrated in FIG. 1. In these figures, the points labelled 91 and 92 are the connections between the drive output 24 of its corresponding unit 4 and the output contact 10 of the switching device 2 respectively.

FIG. 7a is a circuit which could be used to monitor the temperature at various locations. Component 93 is a semiconductor amplifying device shown in this figure as a PNP transistor. Component 94 is a temperature-to-current converter and component 95 is the range setting resistor for component 94.

FIG. 7b is a circuit which can be used to measure the presence and amount of smoke. Component 103 is a semiconductor device shown as an NPN transistor used as a voltage follower. Component 104 is a semiconductor device, shown as an FET, and is used as a buffer for the ionization-type smoke detector, component 105. Components 106 are resistors required to make the circuit practical.

FIG. 7c is a circuit by which the status of a switch can be monitored. This might be required for an intruder alarm system or the remote monitoring of a complex switch board. Component 114 is the switch activating device, shown as a magnet often used to activate a reed switch. Component 114 is the switching device shown as a reed switch. Components 115 are constant current sources and components 116 and 117 are resistors setting the current outputs of their respective current sources. Under normal conditions, the current detected will be either the current associated with the righthand current source, indicating that the switch has not been activated, or the sum of both current sources which indicates that the switch has been activated. It will be appreciated that the integrity of the loop is continuously monitored in that any break (either accidental or malicious) in the loop will be immediately detected because sensors further down the loop will not be able to be able to accessed. It will be further appreciated, that the present invention enables the location at which the break in the integrity of the loop has occurred to be immediately identified.

FIG. 7d demonstrates a circuit in which the invention is used to control lights to indicate a simple pattern, such as an apparently moving strip of lights, moving towards a particular destination such as an emergency exit from a confined space. Alternatively the pattern of lights could be controlled in such a way as to enhance for example an advertising sign. Component 123 is a lighting device or controller for a lighting device, shown as a simple incandescent globe. Component 124 is the constant current source controlling the current through the light source, and component 125 is the current setting resistor.

FIG. 7e is a variation of the temperature monitoring module of FIG. 7a, in which independent verification of the module being accessed is made through a second loop. This second loop could be one of the possible embodiments of the present invention, or a loop as previously described in the Dutch patent No. 82.04306. In this variation a positive verification of the module being currently accessed may be essential and require the running of the additional loop. Components 133, 134 and 135 are the same as components 93, 94 and 95 described in FIG. 7a. Component 136 is a device which communicates between the monitoring and verification loops. This is shown in FIG. 7e as optocoupler. Components 137 are semi-conductor threshold devices comprising a detection loop as per the Dutch patent No. 82.04306. Point 138 is the connection to the outward conductor of the verification loop, and point 139 is the connection to the next detection point in the verification loop.

Figure 8B:
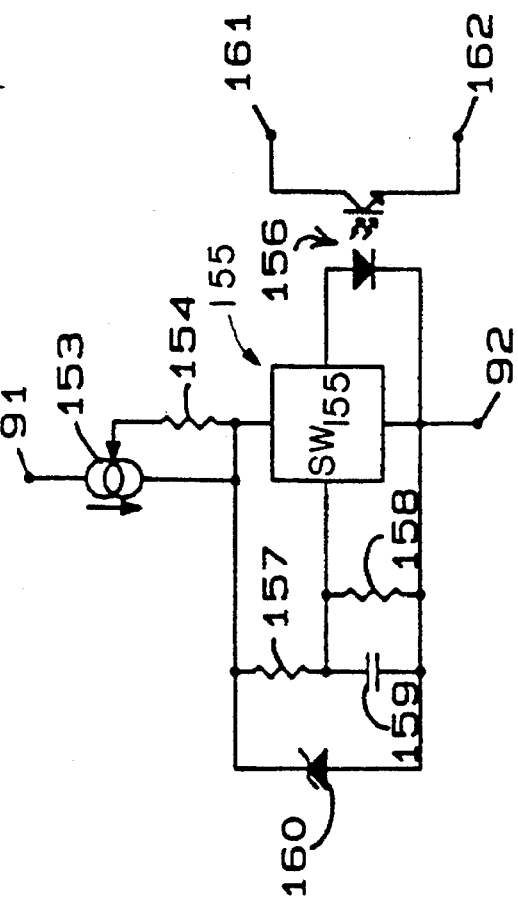
Figure 8A:
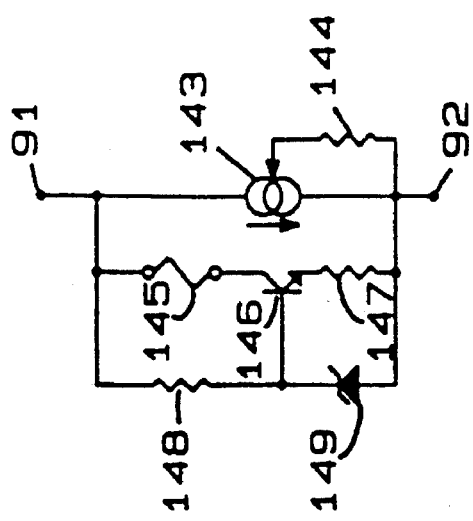

FIG. 8a is an illustration of how the present invention may be utilized to cause an action to be taken at a particular position among many possible positions along the loop. In the example the module is set up to activate an electrically fusible link, such as might be used to turn on a halon or water-based fire extinguisher system. Component 143 is a constant current device, the level of current being set by a resistor 144. These determine the amount of current flowing in the circuit after successful fusing of the controlling link, component 145. The other components of the circuit, NPN transistor 146 resistor 147 and 148 and Zener diode 149 comprise a current limiting circuit used to control the link fusing current.

FIG. 8b is a further illustration of the use of the invention to control an event at some particular position. Constant current source 153 and the current setting resistor 154 provide power to a switching apparatus 155, such as a monostable flip-flop. Component 156 is the signal transfer device between the controlling loop and the apparatus requiring activation or de-activation. In FIG. 8b device 156 is shown as an optocoupler semiconducting device. Components 157, 158 and 159 are two resistors and a capacitor, respectively, providing an appropriate time delay to switching apparatus 155 to eliminate false triggering of the apparatus as the loop is traversed. Component 160 is a Zener diode device which limits the voltage to switching apparatus 155. Points 161 and 162 are the connection points to the device being controlled.

Figure 10:
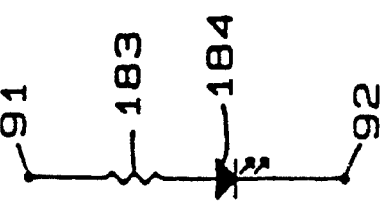
FIG. 10 is a circuit diagram of a second form of termination unit which may be included in the switching device.
Figure 9:
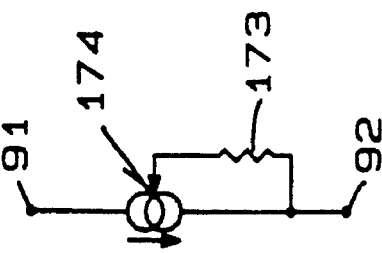
FIG. 9 is a circuit diagram of a first form of termination unit which may be included in the switching device.

FIGS. 9 and 10 show examples of possible practical realizations of the loop termination unit 14 in FIG. 1. In FIGS. 9 and 10, the points labelled 91 and 92 are the connection point between the last switching unit 16 in the loop and the output contact 10, respectively.

FIG. 9 shows the loop termination unit 14 made up of a simple constant current source. This can be used by the loop interface 50 to verify that the end of the loop has been reached by comparing the current value obtained with that expected for the loop termination unit. In this embodiment, component 174 is a semiconductor constant-current device and component 173 is its current setting resistor.

FIG. 10 is another example of a loop termination unit. In this form the loop controller can determine the fact of reaching the last point on the loop by testing for the expected current/voltage relationship through the module. The module is shown as a simple light source such as a light emitting diode (LED). Component 184 is the LED and component 183 is a resistor which provides for the expected current/voltage relationship.

The switching device 2 can be used to give early warning of a fire by continuously monitoring temperature and presence of smoke at various locations in a building. In conventional installations of fire/smoke detection equipment, for example in a large multi-storied building, the sensing modules are connected in loops. Typically, a loop could include all the detectors for one floor of the building. The advantage of this system is that the cabling is keep relatively simple. However, the disadvantages of the conventional system include:

1. an indication of an alarm condition is not accompanied by information as to the precise location of the fire, only an indication of the floor is given. This can result in valuable time being lost in conducting a preliminary search on the indicated floor for the source of the fire, 2. the alarm sensors are threshold devices which often trigger at a late stage of the fire when easy control is no longer possible, 3. where a built-in sprinkler system is present and activated, water damage can be sustained at locations which were not involved in the fire itself. Indeed, water damage can easily do more harm than the fire itself.

In one embodiment of the switching device 2, the comparable system retains the simple cabling and format of the conventional system in that monitoring is divided on a floor by floor basis. However, at each location the temperature and smoke level is measured at a frequency of, for example, every second. All of the data can easily be analyzed by a simple computer system to give a warning should the rate of temperature rise, the actual temperature itself, or the smoke level exceed predetermined values. This warning would be accompanied by identifying the precise location of the site at risk in the form of a display or printed information, or ideally, both. The system could be enhanced by printing a floor plan showing the precise location of the fire as well as indicating the positions of emergency exits and fire fighting equipment.

In a further embodiment of the switching device 2, it is possible to couple the monitoring of sensors with another loop which actually controls various sprinklers in the building. In this way, one or more sprinklers can be selectively activated to control the fire and minimise its spread. A further advantage of the system is that by choosing a fixed and unique loop termination element for each loop, the loop is continuously self-monitoring for integrity. For instance, if the loop is broken, the end condition is not achieved and the fault detected immediately. It will be appreciated that this feature functions independently of the detection of an alarm condition. It will also be noted, that even if the loop has been broken, detectors closer to receiver will still continue to operate normally. In short, if the loop breaks for some reason, the fault will be immediately detected, and there will continue to be partial protection.

The switching device 2 may also be used in an intruder alarm system. The simplest form of an intruder alarm system uses a loop network to include a device fitted to each possible entry point so that unauthorized entry causes an alarm condition in the loop. The usual method is to fit each door and window with a device which goes either open circuit or short circuit should entry be attempted. The cabling associated with this system is kept simple. Such a system is relatively free from the annoying false alarms which are often associated with movement detectors. The disadvantages of this system include:

1. it is relatively easy for a skilled burglar to either short circuit or to open circuit the device, and 2. activation of the alarm requires that all entry points be in the closed position. If this is not the case then no indication is given as to which window or door has been left open.

A comparable system which embodies the invention would associate each entry point with a unique current level in the load transducer/transmitter unit 6.

In effect, each entry point is coded individually both for the open circuit and the closed circuit condition. Scanning around the loop at a sufficiently high frequency effectively checks each entry point for its correct status. The advantages of this system include:

1. it is virtually impossible to determine the value of the current-determining component in a transducer/transmitter unit, and hence to rig up a bypass to fool the monitoring system, 2. activating the system at a time when not all entry points are shut is accompanied by an indication of the precise locations of those which require attention, and, 3. the integrity of the loop is self-monitored as for the fire alarm example described previously.

The switching device 2 may be also used to replace elaborate wire looms of vehicles and monitor a variety of sensors in a vehicle. Also the switching device 2 could be used to operate a sprinkler system where adjacent loads units 6 comprise corresponding moisture and/or head detectors, and activation devices to cause a respective sprinkler to operate. The moisture and/or heat detectors are successively monitored and a sprinkler activated if necessary.

Figure 11:
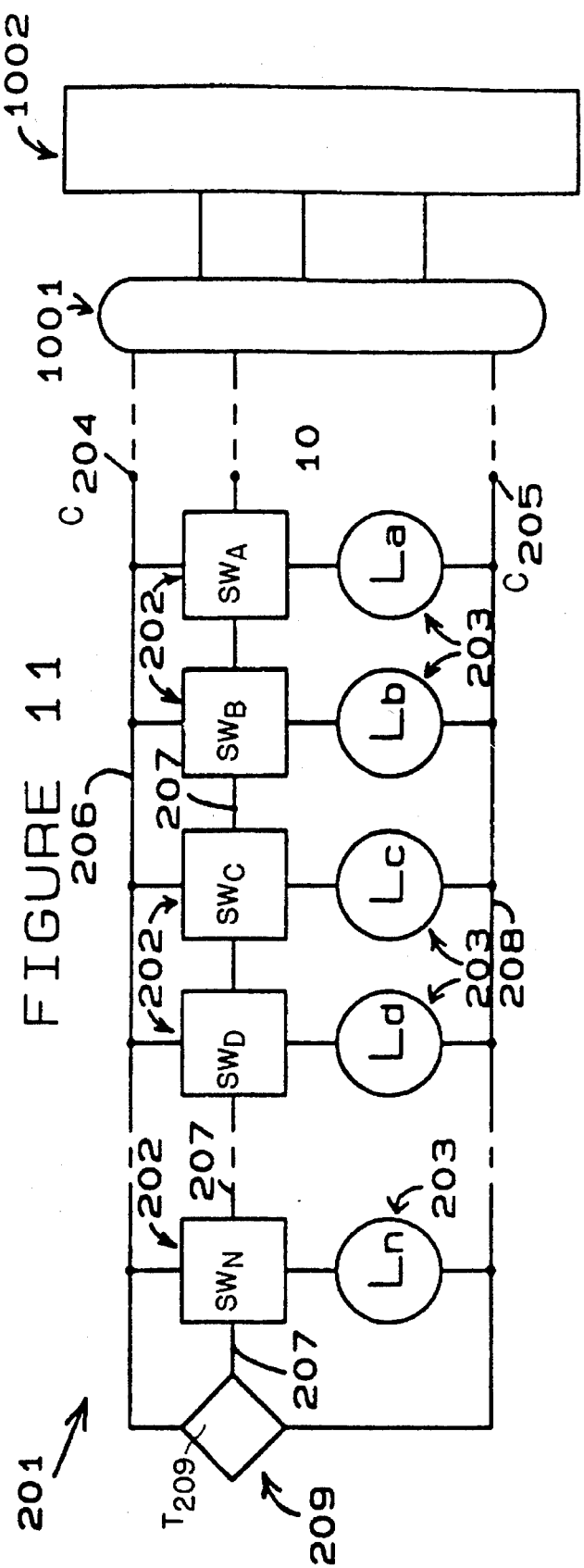
FIG. 11 is a block diagram of a second form of switching device, according to the invention.

A second form of switching device 201, as shown in FIG. 11, includes a plurality of switching units 202 (the first four which are labelled A, B, C, and D, and the last N), a plurality of load units 203 (La to Ln), an input contact 204 and an output contact 205. The switching units 202 are connected in parallel with respect to one another, and with respect to loop power and loop return conductors 206, and 208, respectively. Adjacent switching units 202 are also connected in series by a third conductor 207. Each load unit 203 is connected between its corresponding switching unit 202 and the conductor 208. The load units 203 each include an input and an output. The inputs of the load units 203 are connected to respective switching units 202, and the outputs thereof are connected to the output contact 205 via conductor 208. The input contact 204 is connected to each of the switching units 202 via conductor 206 and to a terminating unit 209. The terminating unit 209 is connected between conductors 206, and 208 and to the last switching unit N via conductor 207.

The switching units 202 are configured to selectively activate one or more of the load units 203 in response to voltage pulses applied to the input contact 204. The output contact 205 is maintained at a voltage such that an activated switching unit 202 after being triggered by a voltage pulse in turn activates a corresponding load unit 203. The activated switching unit 202 supplies a voltage to the corresponding load unit 203 and forms a current loop from input terminal 204 to output terminal 205, via conductor 206, the activated switching unit, the activated load unit, and conductor 208.

In a practical implementation of the invention an initiator unit 1001 is provided which begins the process of monitoring or controlling the load units 203 in the loop formed by the switching device 201. An interface unit 1002 is also provided which allows the switching device 201 to be connected to a controller such as a computer.

A switching unit 202 when activated will supply power to either its respective load unit 203 or the load unit 203 of the succeeding switching unit 202, via the conductor 207, depending on the particular construction of the switching unit as described in detail hereinafter. The load unit 203 which a switching unit 202 activates is herein referred to as its corresponding load unit 203. If the latter is the case, the switching unit 202 when inactivated connects its respective load unit 203 to the conductor 207, which extends between the unit 202 and the preceding switching unit 202, and the preceding unit 202 supplies power to the load unit 203 via the conductor 207. If the former is the case, the initiator unit 1001 includes a respective load unit 203 and the activated unit 202 or 1001 supplies power directly to its respective load unit 203.

The load units 203 may be transducers which provide a current representative of a sensed parameter or control units which cause a predetermined action, such as switching on a light or energising a relay, when activated. Measurement signals or control signals are thereby provided on the loop return conductor 208 and can be accessed or received by computers connected directly to or electrically isolated from the loop return conductor 208.

In one mode, only one of the switching units 202 is activated at one time, and the number of voltage pulses applied to the input contact 204 determines which one of the switching units 202 will supply an activating voltage to a corresponding load unit 203. With an appropriate voltage pulse only one of the switching units 202 and load units 203 are activated at a given time.

In another mode, more than one switching unit 202 may be activated at any one time provided at least one inactivated switching unit 202 is maintained adjacent each activated switching unit 202. This allows a large group of load units 203 to be monitored simultaneously, which may be required for monitoring alarm conditions. When a change in status of the loop is detected, the loop is then sequentially accessed to determine the actual load unit at which the alarm condition exists.

Figure 12:
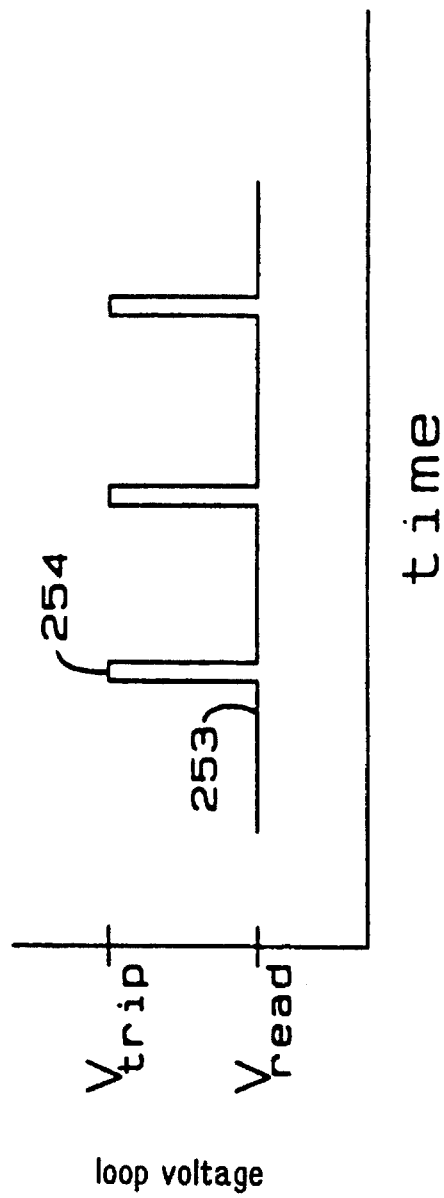
FIG. 12 is a waveform diagram of a voltage signal which may be used to control the switching device.

FIG. 12 shows a generalised voltage waveform required to activate and deactivate the switching units 202 of the device 201. In general, two voltages are required. A dc voltage 253 (Vread) at which measurement can be made or an action taken, and a higher voltage pulse 254 (vtrip) which causes the load unit 203 currently connected to the loop to disconnect and the next load unit 203 in the loop to be connected.

Initial application of the voltage Vread to the conductor 206 and activation of the initiating unit 1001, activates the first lead unit 203 of the device 201 and the current therefrom is monitored. As discussed previously the first lead unit 203 may be part of the initiating unit 1001 or connected to the first switching unit 202. When the voltage pulse $V_{trip}$ is applied to the conductor 206 and the initiating unit 1001 deactivated, the first lead unit 203 is disconnected from the loop and the second lead unit 203 is connected. Application of a further voltage pulse $V_{trip}$ now activates the third lead unit 203 and deactivates the second lead unit 203. The next voltage pulse connects into the loop the fourth lead unit 203 (and disconnects the third lead unit 203) and so on until each of the lead units 203 in the switching device has been accessed in turn. Repetition of the sequence of actions described above provides for multiple readings or control actions at each of the lead units. In this way information can be independently obtained from or control actions effected at a large number of locations or nodes on a three conductor loop.

It will be appreciated that it is the voltage pulses $V_{trip}$ on the loop which determine the switching between lead units 203 and triggering of the corresponding switching units 202. However, it is the current in the loop which is a function of the parameter monitored by the activated lead unit associated with and controlled by the switching unit 202 currently connected to the loop. It will be appreciated that operating the switching units 202 and a lead units 203 in a current mode has all of the advantages of data transmission usually associated with a current loop such as relative immunity from noise.

It should also be noted that the switching device 201 and the conductors 206 and 208 need not be terminated and can be arranged in a continuous electrical ring form so that once initiated by a initiating circuit connected in parallel, $V_{trip}$ pulses can be applied to the ring to sequentially advance the activated load unit or units along the ring each time a pulse is applied. Measurements from the activated load units 203 could be taken by a measuring circuit or computer, as discussed previously, connected across the conductors 206 and 208.

Figure 13:
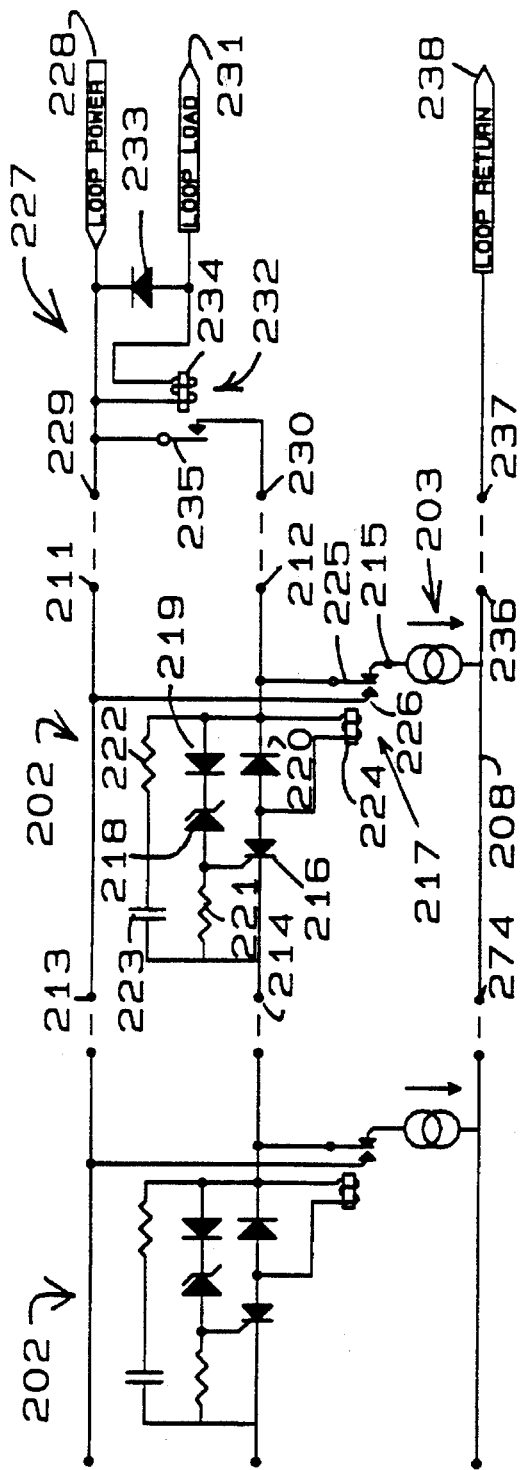
FIG. 13 is a circuit diagram of a first preferred embodiment of the second form of switching device and first preferred embodiments of switching units of the device.

A switching unit 202, as shown in FIG. 13, includes inputs 211 and 212, a power output 213, bypass output 214, a drive output 215, silicon controlled rectifier (SCR) 216, a relay 217, Zener diode 218, diodes 219 and 220, resistors 221 and 222 and a capacitor 223. The coil 224 of the relay 217 is connected between the input 212 and the junction of the anode of SCR 216 and the cathode of diode 220. The switch 225 of the relay 217 is connected between the input 212 and the drive output 215 when the relay is not energised. The switch 225 is connected between input 212 and input 211 when the relay is energised. The cathode of SCR 216 is connected to the bypass output 214, the resistor 221 and capacitor 223. Diode 220 is connected across the coil 224 of relay 217 to protect the switching unit 202 from back EMF when the coil 224 is de-energised, with the anode of diode 220 connected to the anode of SCR 216 and its cathode to input 212. The anode of Zener diode 218 is connected to the gate of SCR 216 and its cathode to the cathode of diode 219. The anode of diode 219 is connected to input terminal 212. Resistor 222 is connected between input 212 and capacitor 223. Normally open contact 226 is connected to input 211. A threshold circuit is formed by the SCR 216, Zener diode 218 and resistor 221.

An initiating unit 227, as shown in FIG. 13, includes an input 228, outputs 229 and 230, an activating input 231, a relay 232 and a diode 233. The coil 234 of relay 232 is connected between input 228 and activating input 231. The switch 235 of the relay 232 is connected between input 228 and output 230 when the relay is energised. The cathode of diode 233 is connected to input 228 and its anode to the activating input 231.

When the voltage Vread is first applied to input 228 of the switching device 201, all the switching units 202 and the initiating unit 232 are de-energised, and no lead units 203 are activated. Furthermore, no voltage is applied to the threshold circuits of any of the switching units 202, i.e., across the input 212 and output 214. When the voltage Vread 253 is applied to input 228, the activating input 231 is held low and relay 232 is energised, which results in switch 235 closing and the voltage applied to input 228 is transferred via output 230 of initiating unit 227 to input 212 of the first switching unit 202. The lead unit 203 connected to first switching unit 202 at drive output 215 is now activated and controls the current which is returned via output 236 on conductor 208 to the interface return 238. At the same time the voltage applied to input 228 is now present at the anode of diode 219. However, the magnitude of Vread is selected so that it does not exceed the total of the breakdown voltage of Zener diode 218 and the voltage drop across diode 219 ensuring that insufficient current flows, and that therefore SCR 216 remains in a nonconducting state, and that therefore the relay 217 remains de-energised.

The magnitude of $V_{trip}$ voltage 254 is selected so that it is greater than the total of the breakdown voltage of Zener diode 218 and the voltage drop across diode 219. Thus, application of the voltage pulse $V_{trip}$ thereafter to input 228 causes Zener diode 218 in series with diode 219 to conduct, this results in the triggering of SCR 216 into its conducting state. With SCR 216 now in its conducting state the coil 224 of relay 217 is energised and the switch 225 of relay 217 now closes to connect switch point 226 directly to input 212. This results in the disconnection of load unit 203 from the first switching unit 202. This state will be maintained even after the voltage applied to terminal 228 returns to the Vread voltage 253 so long as the current flowing through the SCR 216 exceeds its holding current, which is relatively small. At this time the initiating input 231 is disconnected causing the relay 232 to be de-energised resulting in output terminal 230 being disconnected from terminal 228. Thus the voltage applied to input 228 has been transferred via output 229, input 211 and switch 225 to the coil 224 of relay 217, SCR 216 and from the bypass output 214 to activate the load unit 203 connected to the second switching unit 202. The values of resistor 222 and capacitor 223 are selected to provide a time constant, the value of which is related to the width and magnitude of the voltage pulse applied to input 228. This time constant is selected to ensure that only one switching unit 202 is activated by a single pulse Vtrip. Successive voltage pulses $V_{trip}$ applied to input 228 in a similar manner activate the succeeding switching units 202 to activate successive load units 203. When a load unit 203 is disconnected from the supply conductor 206 the voltage across the output 214 and input 212 of the threshold circuit of the preceding switching unit 202 falls to zero thus de-energising its relay 217 and disconnecting the preceding load unit 203 associated therewith. It will be noted that activation of initiating input 231 is only required once to begin the process, and hence remains inactivated during the period when switching units B to N are activated.

In this mode there is no limit to the number of switching units which may be connected to the switching device 201, as only two voltage levels are required to maintain operation. The practical limit to the number of units is dictated only by the time it takes to access the information at each location. For example, if it takes 5 ms to activate and measure a load unit 203 associated with a switching unit 202, then for a 1000 module loop, the time between readings of the device 201 will be 5 seconds.

Figure 15:
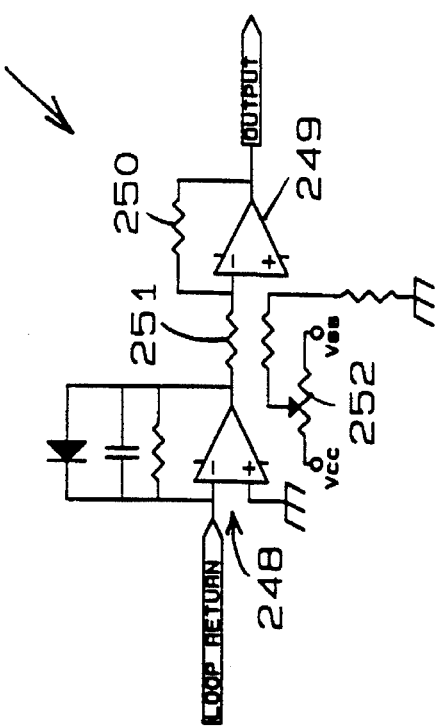
FIG. 15 is a circuit diagram of an interface for conversion of the current returned from the switching device to a voltage output which can be read, after conversion, by an analog to digital converter, by, for example, a computer.
Figure 14:
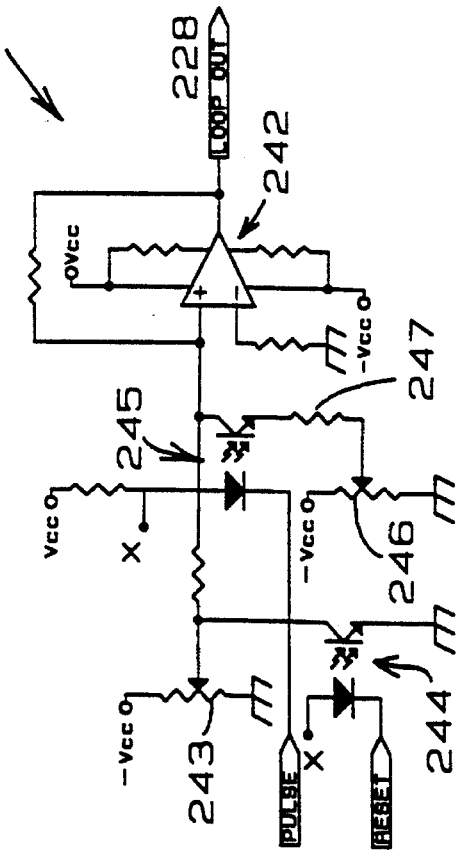
FIG. 14 is a circuit diagram of an interface for producing a voltage signal used to control the switching device.

A first interface 240, as shown in FIG. 14, is used to drive the switching device 201, and a second interface 241, as shown in FIG. 15, is used to receive a current signal from the selectively activated load units 203.

The interface 240 includes a driver amplifier 242 the output of which is set at Vread by the potentiometer 243. Interface 240 includes an opto-coupler 244 so that when the LED of opto-coupler 244 is activated the output of the driver amplifier is reduced to a sufficiently low voltage to force all switching units 202 of the switching device 201 to be in the de-energised form and for none of the corresponding load units 203 to be activated, in effect this is the hard reset.

Interface 240 also comprises optocoupler 245 connected to potentiometer 246 via resistor 247 such that activation of the LED of opto-coupler 245 results in the driver amplifier output voltage going to Vtrip.

The second interface 241 comprises a current to voltage converter amplifier 248 driving an inverting amplifier 249 with a gain set by the ratio of resistors 250 and 251 to produce an output range appropriate to the function of the device 201. Potentiometer 252 is connected to inverting amplifier 249 in such a manner as to allow the output of amplifier 249 to be appropriately zeroed.

A second switching unit 260, as shown in FIG. 16, is similar to the first switching unit 202 illustrated in FIG. 13 except that the threshold circuit comprises a diac 261 in place of the SCR 216, Zener diode 218 and resistor 221 of switching unit 202 of FIG. 13. One of the main terminals of diac 261 is connected to the anode of diode 220 and its other main terminal connected to the anode of diode 262. Diac 261 is triggered into conduction when the voltage across the two main terminals exceed its switching voltage. Diode 262 provides reverse blocking between successive switching units 202. Application of a voltage pulse to input 211 such that this voltage pulse exceeds the switching voltage of diac 261 causes this device to be triggered into a conducting state. At the same time the switch 225 of relay 217 switches to connect input 226 to input 212, and disconnects the load unit 203 from its voltage source, and additionally causes the diac 261 of the preceding unit to return to a non conducting state as the current through this device falls to a value below the holding current of the device.

Another switching device 290 of the second form is shown in FIG. 17 and comprises three switching units 202. The units 202 include a capacitor 223, resistor 222, resistor 221, Zener diode 218, diode 219, SCR 216 and load unit 203 as described for switching unit 202 of FIG. 13. The function of relay 217 of switching unit 202 of FIG. 13 has been replaced by a resistor 273, p-channel MOSFET 272, n-channel MOSFET 271 and an optocoupler 270. Resistor 273 is connected between input 211 and the gate of MOSFET 272. The gate of MOSFET 271 is connected to the gate of MOSFET 272. Both MOSFETs 272 and 271 have their drain terminals connected together and to terminal 212. The source terminals of the MOSFETs 272 and 271 are connected respectively to the supply conductor 206 and the drive output 277. Opto-coupler 270 comprises an NPN transistor 276 with its collector connected to the gate of MOSFET 271 and its emitter connected to output 277. The cathode of the LED 278 of opto-coupler 270 is connected to the anode of SCR 216 and its anode is connected to input terminal 212. In the initial condition, transistor 276 is reverse biased and MOSFET 271 is held in the conducting state and MOSFET 272 is held in the non-conducting state by virtue of the bias resistor 273. Application of a voltage pulse to input 212 via the preceding switching unit 202 exceeding the trip voltage of the threshold circuit causes SCR 216 to switch to its conducting state. This pulls current through the LED 278 of the opto-coupler 270 and causes the transistor 276 of the opto-coupler to saturate, with the effect of forcing MOSFET 271 into a non-conducting state and MOSFET 272 into a conducting state. Load unit 203 of switching unit 202 is now effectively disconnected from its power source, however, the load unit 203 of the succeeding switching unit 202 is now operative via current drawn through input terminal 211, through MOSFET 272, through the LED 278 of optocoupler 270, SCR 216, output terminal 214 to input terminal 279 and MOSFET 280. In the preceding switching unit 202 the current through SCR 281 falls below its holding value and MOSFET 282 returns to the non-conducting state while MOSFET 283 is now in its conducting state. The load unit 203 of the preceding switching unit 202 now no longer contributes to the current returned to the interface. As with the circuit described in FIG. 13, the circuit of FIG. 17 requires an initiator unit to commence a cycle of measurements. The circuit diagram of a practical implementation of such an initiator unit 350 is shown in FIG. 18. This circuit consists of interface inputs 228, 238 and 231; outputs 229,230 and 237; a p-channel MOSFET 351 connected so that its source is joined to input 228; an n-channel MOSFET 352 connected so that the drains of both MOSFETs are joined and that the gate junctions of both MOSFETs are joined, MOSFET 352 having its source terminal connected to a resistor 355; an opto-coupler 356 connected so that the collector of its phototransistor 358 is joined to the gates of the MOSFETs and its emitter is joined to the source of MOSFET 352, the cathode of LED 359 of the opto-coupler 356 is joined to input 231; a resistor 353 which joins input 228 and the anode of LED 359; the resistor 355 joining the source of MOSFET 352 to input 238; an opto-coupler 357 connected so that the anode of the LED 360 thereof is connected to the drains of the MOSFETs and the cathode of the LED 360 is connected to the anode of a blocking diode 349, the collector of a phototransistor 361 of the opto-coupler 357 is connected to the gates of the MOSFETs and the emitter to input 238; and a resistor 354 joining input 228 to the gate of MOSFET 351. The output 230 is connected to the cathode of the diode 349 and the inputs 228 and 238 are connected respectively to the conductors 206 and 208 as shown in FIG. 17 and the outputs 229 and 237, as shown in FIG. 18.

When voltage is initially applied to the initiator unit 350 through inputs 228 and 238, MOSFET 351 will be in its non-conducting state because of the presence of resistor 354. Consequently, MOSFET 352 will be in its conducting state. When a low voltage pulse is applied to input 231, the LED 359 will emit photons causing phototransistor 358 to saturate thus forcing MOSFET 352 into its non-conducting state. This, in turn, causes MOSFET 351 to become conducting and a current path is formed from input 228, through MOSFET 351, LED 360, diode 349 and the load unit 203 associated with the first switching unit 202 in the switching device. It will be noted that this condition is maintained even after the input terminal 231 is returned to a high voltage level because phototransistor 361 will be saturated and thus will maintain MOSFET 352 in its nonconducting state. When a voltage pulse 254 (Vtrip) is applied to the input, the p-channel MOSFET 282 of the first switching unit 202 of the switching device 290 will be forced into its conducting state as described above. Thus the voltage at output 230 will become the same as that at the drain of MOSFET 351, and the current through LED 360 drops to zero. Consequently, LED 360 will extinguish causing phototransistor 361 to become non-conducting which in turn causes the MOSFETs 351 and 352 to return to their initial state wherein MOSFET 351 is non-conducting and MOSFET 352 is conducting. In this way, a cycle of measurements can be initiated in the switching device 290.

FIG. 19a is a circuit diagram of a switching device 292 which differs in the mode of successively activating load units from that of the switching device described in FIG. 13 in an important way. The major disadvantage of using the voltage level of pulses to trip successive switching units into the loop is that the pulse width must be carefully controlled. If this is not done then the one to one correspondence between the number of pulses sent and the position of the load unit 203 activated on the switching device could be lost. This can be detected in several ways. One method is to use a termination module at the end of the loop which has a characteristic output. This will indicate when the end of the loop has been reached and so allow the computer or controller to check that the correct number of pulses have been sent. An alternative is to have adjacent switching units connected to load units which output currents in non-overlapping ranges to the current loop. This provides a direct check that the trip voltage has advanced the position of the activated switching units by one. Indeed, if all of the load units operated in one of three non-overlapping current ranges, a high degree of verification for correct operation is possible.

However, a preferred method of operation is to use the edge of a pulse to effect switching between switching units, as is the case in the switching device 292. In this embodiment of a switching device, switching between switching units 202 does not occur as a function of the inputted voltage to the switching device 292. Switching between switching units 202 can be made to occur on either the rising or the falling edge of a voltage transition inputted to the switching device 292. A complete switching device 292 is shown in FIG. 19a and consists of: an initiating unit 300, comprising optically coupled triac (OCT) 301 and load unit 201a; a switching unit 302 comprising OCT 303, load unit 202a and a trigger network comprising resistor 304, diodes 305 and 306, and capacitor 307; switching unit 315 is identical to switching unit 302 with the exception that it comprises load unit 203a; switching unit 308 again identical to switching unit 302 except that it comprises load Na; and terminating unit 309 comprising opto-coupler 310, trigger network comprising resistor 311, diode 312 and capacitor 313, all connected as shown in FIG. 19a.

In the switching unit 302, the diode 306 is connected across the inputs, 211 and 212 with its cathode connected to the input 211. The resistor 304, LED 303a of OCT 303 and diode 305 are connected in series. The resistor 304 and cathode of the diode 305 are connected to the input 236 and loop return conductor 238 and the LED 303a is connected therebetween. The capacitor 307 is connected between the anode of the diode 306 and the junction of the diode 305 and the cathode of the LED 303a. The triac of the OCT 303 is connected in series with the load unit 202a and both are connected between the conductors 206 and 208.

Figure 21A:
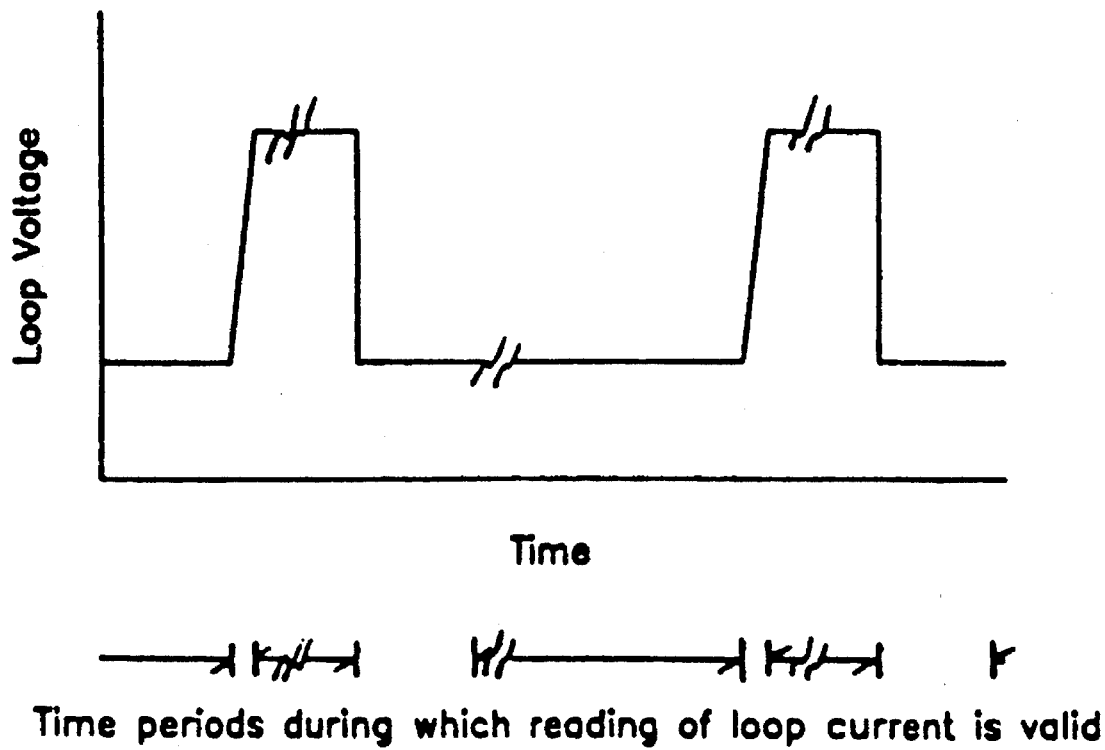
Figure 21B:
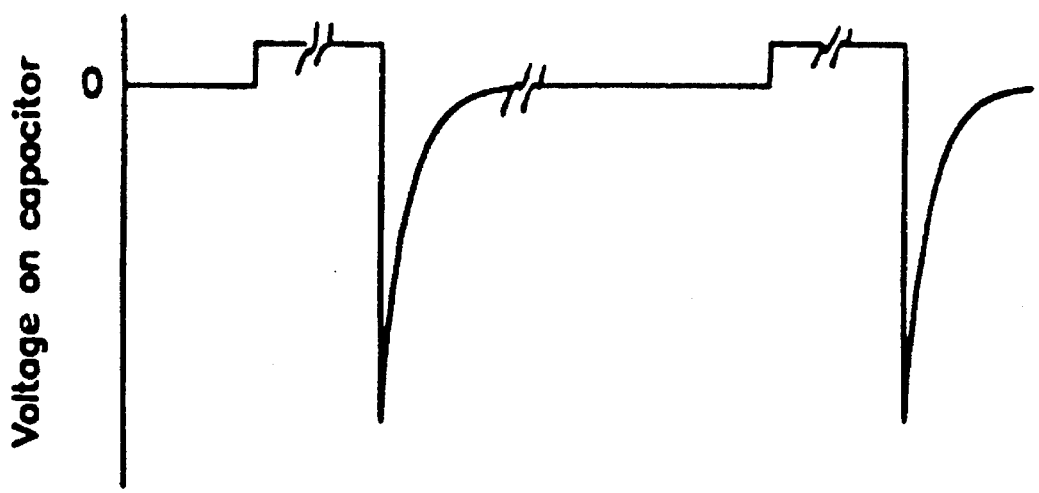

Switching between switching units of the device 292 occurs on the high to low transition of a pulse. When voltage is initially applied to the interface terminal 228, all switching units will be disconnected because all triacs associated with load units will be in their non-conducting state. The process of starting a series of readings from the switching device 292 occurs when a low voltage pulse is applied to terminal 231 of the initiating unit 300. This causes the LED in OCT 301 to emit photons and force the associated triac into conductance. Thus a current loop is formed between terminal 228, the triac 301a of OCT 301, load 201a and terminal 238, with the current in the loop being determined by the characteristics of load 201a. As long as the current through the triac 301a is greater than its holding current, the triac 301a will continue to conduct even after the LED in OCT 301 has ceased to emit photons. Capacitor 307 will become charged through the current path of the triac 301a and diode 305. Capacitor 307 is the only capacitor in the switching device which will have a charge. This state is stable while the voltage applied to terminal 228 is steady or if it is rising. On the application of a voltage pulse to input terminal 228, the capacitor 307 rapidly charges to the new voltage level and remains there during the time input terminal 228 is at the higher voltage level. However, on the a high to low transition of the voltage pulse applied to terminal 228, diode 306 connected between the capacitor 307 and the supply conductor 206 is now forward biased and rapidly discharged to one diode voltage drop above the original voltage level applied to input terminal 228. At the same time, as the voltage of the connection point between capacitor 307 and the anode of diode 306 is returning to its original value, the triac of OCT 301 is reversed biased and returns to its non-conducting state thus removing load unit 201a from the loop. Diode 305 is now reversed biased and the negative discharge path is via the LED of OCT 303 and resistor 304 causing the triac of OCT 303 to switch to its conducting state. FIG. 21a illustrates the waveform of the loop voltage applied to terminal 228 and FIG. 21b illustrates the waveform of the resulting voltage at the junction of the capacitor 307 and the anode of diode 305 during the triggering process discussed above with reference to FIGS. 19a and 19b.

The length of time and the intensity with which the LED emits photons will be a function of the size of capacitor 307, and the time constant of the capacitor and the resistance of the discharge path of the capacitor. For this reason, the voltage source should have a low output resistance so that the main resistive component of this path is provided by resistor 304 which allows the greatest control over the photon emission of the LED. The current now flowing through interface terminals 228 and 238 is controlled by load 202a. Thus with each high to low transition in the voltage pulse $V_{trip}$ applied to interface terminal 228, successive loads are switched to control the current flowing in the switching device. When the last switching unit 308, has been activated, the terminating unit 309 is provided to switch it off. The trigger network consisting of the LED associated with optocoupler 310, resistor 311, diode 312 and the capacitor 313 have the same function as equivalent components in switching unit 302. Thus when a high to low transition of the voltage applied to interface terminal 228, capacitor 313 will discharge causing the LED in opto-coupler 310 to emit photons causing the phototransistor in opto-coupler 310 to saturate effectively shorting out the triac. Once capacitor 313 has discharged the phototransistor will return to its non-conducting state. There will then be no load unit switched into the switching device 292. The cycle can now be repeated by applying a pulse to terminal 231 of the initiating unit 300.

FIG. 19b is a circuit diagram of a switching unit 602 which can replace the switching unit 302 of FIG. 19a. The switching unit has a modified trigger network. The trigger network now consists of capacitor 307, diode 305, LED of opto-coupler 303, resistor 304 and an additional LED of opto-coupler 603 connected as shown in FIG. 19b. In addition, a further current path is provided between the output 207 and input 236 by placing a limiting resistor 604 and the phototransistor of optocoupler 603 in parallel with Load 202a connected as shown in FIG. 19b. In this implementation of the invention each switching unit 602 will take the status of the preceding switching unit with each high to low transition of the voltage applied to input 211. If a particular switching unit 602 is currently in its switched off state, that is, if the triac associated with OCT 303 is non-conducting, and the preceding switching unit is in its activated state then it will become activated on the high to low transition of the voltage applied to input 211 as described for switching unit 302. Because the phototransistor of opto-coupler 603 will be saturated for the duration of the pulse generated by the triggering network, additional current will be drawn through the triac of OCT 303 for this period. At the end of this period the phototransistor of opto-coupler 603 will become nonconducting and the only current through triac of OCT 303 will flow through the Load 202a. If a particular switching unit 602 is currently activated, and the preceding switching unit is inactivated, then it will become inactivated on the high to low transition of the voltage applied to input 211 as described for switching unit 302. However, if both a particular switching unit 602 and the preceding switching unit are activated then it will not become inactivated on the high to low transition of the voltage applied to input 211. This is because the pulse generated in the trigger network will cause the phototransistor of opto-coupler 603 to saturate and so shorts the charged capacitor equivalent to capacitor 307 in the succeeding switching unit to the loop return. As a consequence the triac of OCT 303 is not reversed biased and remains in its conducting state. In this way, switching units 602 adopt the status of the preceding switching unit with each high to low transition of the voltage applied to input 211. Therefore, any combination of activated and inactivated switching units can be advanced in response to the controlling transition or state. This implementation of the invention could be useful in, for instance, controlling a series of apparently moving lights in any pattern.

FIG. 20 is a circuit diagram of a terminating unit 340 which can be used as an alternative to the one shown in FIG. 19a. This consists of a discharge diode 344 and a trigger network made up diode 341, resistor 342 and capacitor 343 connected as shown in FIG. 20. When the last switching unit of the switching device 292 is activated, capacitor 343 will be charged. Immediately after a high to low transition on the voltage applied to the interface terminal, the capacitor 343 will discharge through the current path provided by resistor 342 and the parallel path of the last load unit and the voltage source via diode 344. This forces the conducting triac connecting the last load unit to the switching device into its nonconducting state.

Figures 23A, 23B, 24:
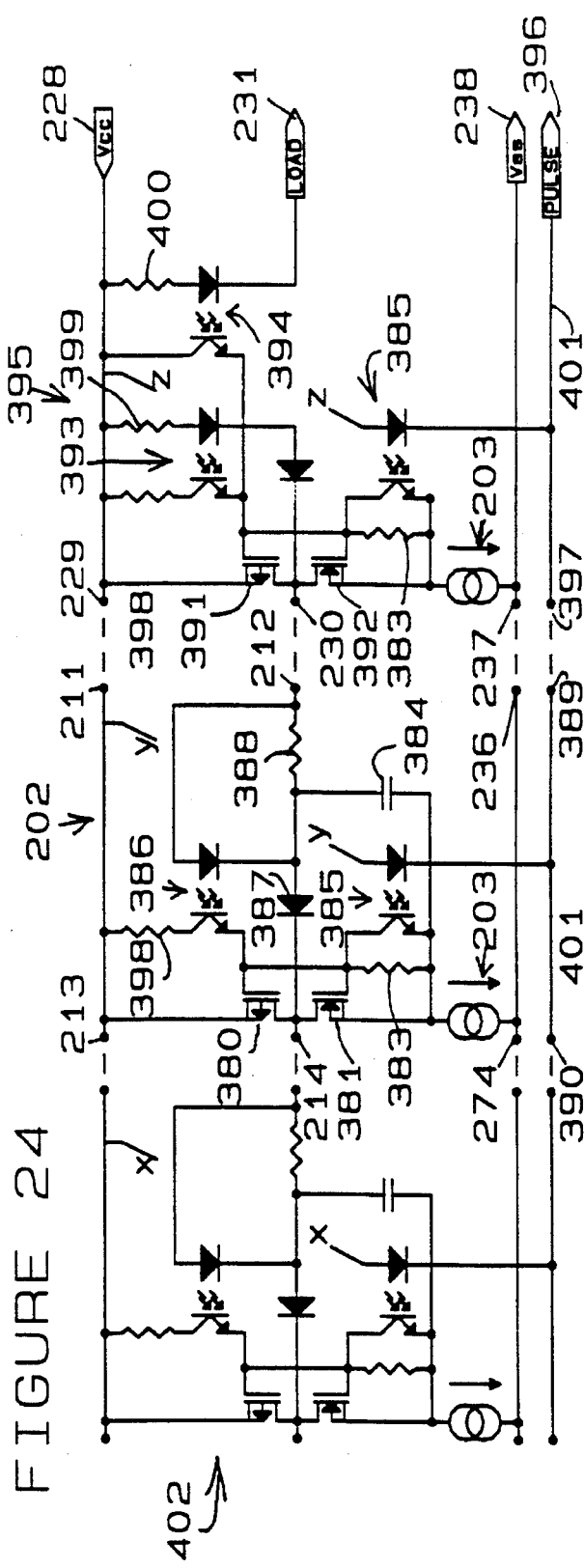
FIGS. 23a and 23b are circuit diagrams of two alternative embodiments of switching units of the edge-triggered switching device.
FIG. 24 is a circuit diagram of a preferred embodiment of a switching device which utilises a fourth conductor to effect sequential switching.

Because the capacitor in the trigger network must supply sufficient charge to reliably switch off the associated triac, the switching unit circuits illustrated in FIGS. 19a and 19b are most suitable for applications where only a relatively small current flows in the switching device 292. Otherwise the size of the capacitor becomes prohibitively large. FIG. 22 is a circuit diagram of a switching device 294 which is suitable for use where relatively high currents flow in the switching device. The initiating unit 320 and the terminating unit 324 are identical to initiating unit 300 and terminating unit 309 of FIG. 19a, respectively. The switching units have a modified trigger network. The trigger network now consists of capacitor 325, diode 326, resistor 328, the LED of OCT 327 and an additional LED of opto-coupler 329 connected as shown in FIG. 22. The diode 306 in FIG. 19a has been replaced by the phototransistor of opto-coupler 329. The first load is switched into the switching device 294 and capacitor 325 will be charged as described above. Immediately after a high to low transition of the voltage applied at the interface terminal 228, capacitor 325 will discharge through the current path provided by the resistor 328, and the LED in OCT 327, and the LED in opto-coupler 329 and the resistance offered by Load 201a. Both LEDs in the trigger network will emit photons with a pulse whose length is a function of the capacitance of capacitor 325 and the resistance of the discharge path. This causes the triac of OCT 327 to conduct (and switches in Load 202a to the switching device 294 as described above) and the phototransistor 329a of opto-coupler 329 to saturate. The phototransistor 329a shorts out the triac in OCT 330 of the initiating unit 320. After capacitor 325 has discharged, the phototransistor of opto-coupler 329 will return to its non-conducting state. In this manner, Load 201a has been removed from the current path in the switching device, FIG. 23a is a circuit diagram of a third preferred embodiment of a switching unit 296 of the edge-triggered switching device. The switching unit 296 consists of a triggering network consisting of capacitor 307, resistor 304, diode 305 and the LED of OCT 303 which is identical to the trigger network described for FIG. 19a; a relay 217, a discharge diode 306 and a blocking diode 316. The normally open contact 226 of relay 217 is connected to input line 211, the switch 225 of relay 217 is connected to input 212 and the normally closed contact 215 of the relay is connected to the load unit 203. The coil 224 of relay 217 is connected between input 212 and the triac in OCT 303. The other lead of the triac is connected to the anode of diode 316. The cathode of diode 316 is joined to the output 214. Capacitor 307 is connected to input 312. When voltage is initially applied to the switching device 292 through lines 211 and 236, all relays will be in their de-energised state and no current will flow in the switching device. Therefore an initiating unit such as that described for FIG. 13 is required before the first switching unit. Similarly, a terminating unit such as that shown in FIG. 19a or FIG. 20 should be added to the end of the switching device to ensure correct completion of a measuring cycle.

Consider the case where the previous switching unit has been activated and therefore input 212 is directly connected to input 211 through its energised relay. Current cannot flow from input 212 to output 214 because the triac in OCT 303 is in its non-conducting state. Capacitor 307 will be charged. This capacitor 307 and the equivalent capacitor of the preceding switching unit will be the only capacitors charged in the switching device. Immediately after a high to low voltage is applied to input 211, the capacitor 307 will discharge causing the LED in OCT 303 to emit photons. This forces the triac of OCT 303 into conduction and current now flows through coil 224 of relay 217, triac of OCT 303, diode 316 and through the load unit 203 associated with the next switching unit. Because of this current flowing through the coil 224, relay 217 become energised and its contact 225 directly joins inputs 211 and 212. Current through the triac in the preceding switching unit will cease and its relay is short circuited and will revert to the de-energised state. In this manner successive load units are switched into and out of the current path in the switching device.

FIG. 23b is the circuit diagram of a fourth preferred embodiment 298 of an edge-triggered switching unit of the switching device. This is a solid-state implementation of the relay version described above. The switching unit 298 consists a trigger network as described above consisting of capacitor 307, diode 305, resistor 304 and the LED of OCT 303. In this implementation there is a second trigger network connected in parallel with the first. This consists of capacitor 371, diode 372, resistor 373 and the LED of opto-coupler 374. The phototransistor of opto-coupler 374 is connected so that its emitter is connected to input 212 and its collector to the cathode of blocking diode 375 and capacitors 307 and 371. The anode of diode 375 is connected to input 212. The collector of the phototransistor in optocoupler 370 is connected to input 211 and its emitter connected to capacitors 307 and 371 and to the anode of the LED in opto-coupler 370. The cathode of the LED in optocoupler 370 is joined to the triac in OCT 303 and the other lead of this triac is connected to output 214. The load unit 203 associated with the switching unit is connected to input 212. The discharge diode 306 is connected with its anode to input 212 and its cathode to input 211. To make a complete switching device using the switching units shown in FIG. 23b will required the addition of a suitable initiator unit at the beginning of the switching device and a suitable terminator unit at the end of the switching device. The units already described are suitable for use in this regard.

Consider the case when the previous switching unit has been activated. Current will pass through input 212 and through the load unit 203. Both capacitors 307 and 371 will be charged through current passing through the blocking diode 375, and together with the equivalent capacitors in the preceding switching unit will be the only fully charged capacitors in the switching device. Current cannot flow to the output 214 because the triac in OCT 303 is in its nonconducting state. Immediately after a high to low transition in the voltage applied to input 211, both capacitors 307 and 371 will discharge. As capacitor 307 discharges, the LED in OCT 303 will emit photons forcing its triac into conduction. This allows current to flow from input 212, through diode 375 to the output 214 to the load associated with the next switching unit. However, as this current flows the LED in opto-coupler 370 will light and thus force phototransistor in opto-coupler 370 into saturation. Because the cathode of diode 375 is now at a higher potential than its anode, current will cease to flow through it. At the same time capacitor 371 will discharge causing the LED of opto-coupler 374 to emit photons and so causing its phototransistor to saturate. So long as the phototransistor is still in saturation when the phototransistor of opto-coupler 370 is fully conducting current will cease to flow in input 212 and the triac of the preceding switching unit will become non-conductive because it is short circuited by the path created by the conducting opto-couplers 370 and 374. This in turn will force its phototransistor to the non-conducting state because its associated LED will have extinguished. In this manner successive load units are switched into and out of the current path in the switching device with each high to low transition of the applied voltage.

FIG. 24 is a circuit diagram of a variation of the invention in which a switching device 402 has switching units 202 joined together by four conductors rather than three. In this implementation the voltage supplied to the switching units by input 228 and 238 is kept constant and switching from one switching unit to another is accomplished by a low voltage pulse applied to a pulse line 401. The switching unit 202 is made up of inputs 211,212,236 and 389; outputs 213,214,274 and 390; a p-channel MOSFET 380 whose source is connected to input 211; a n-channel MOSFET 381 whose source is connected to the load unit 203 associated with the switching unit 202, the drain junctions of both MOSFETs are joined together and also to output 214, and the gate junctions of both MOSFETs are joined together; a resistor 383 joins the gate of MOSFET 381 to its source; an opto-coupler 385, the emitter and collector of the phototransistor of which is connected to the source and gate of MOSFET 381, respectively, and the anode and cathode of the LED of the opto-coupler 385 is connected to input 211 and input 389, respectively; a capacitor 384 connects the source of MOSFET 381 and the anode of blocking diode 387 whose cathode is connected to output 214; an opto-coupler 386, the emitter of the phototransistor of which is connected to the gate of MOSFET 380 and the anode and cathode of the LED of the opto-coupler 386 is connected to input 212 and the anode of diode 387, respectively; a resistor 388 which joins input 212 and the anode of diode 387; and a resistor 398 which joins input 211 and the collector of the phototransistor in opto-coupler 386.

When power is initially applied to the switching device through input 211 and 236, MOSFET 381 will be forced into its non-conducting state because of the presence of the bias resistor 338 connecting the MOSFET 381 to the low voltage conductor 238, and consequently MOSFET 380 will be in its conducting state. Therefore no current will flow in the switching device. For this reason an initiator unit 395 must be provided in order to begin a measurement cycle in the switching device. The initiator 395 is similar to the switching unit 202. It consists of inputs 228, 231, 238, 396; outputs 229, 230, 237, 397; a p-channel MOSFET 391 whose source is connected to input 228; a n-channel MOSFET 392, the source being connected to the load unit 203, the gate and drain being connected to the gate and drain of MOSFET 391, respectively, and the drain junctions being connected to output 230; a bias resistor 383 joins the gate and drain of MOSFET 392; an optocoupler 385, the collector and emitter of the phototransistor of which is connected to the gate and source of MOSFET 392, respectively, and the anode and cathode of the LED of the opto-coupler 385 are connected to inputs 228 and 396, respectively; an optocoupler 393, the emitter of the phototransistor of which is connected to the gate of MOSFET 391 and the cathode of the LED of the opto-coupler 393 is connected to output 230; an opto-coupler 394, the emitter and collector of the phototransistor of which is connected to the gate of MOSFET 391 and input 228, respectively and the cathode of the LED of the opto-coupler 394 is connected to input 231; resistor 398 joins input 228 to the collector of the phototransistor in opto-coupler 393; a limiting resistor 399 joins input 228 to the anode of the LED in opto-coupler 393; and limiting resistor 400 joins input 228 to the anode of the LED in opto-coupler 394.

As with the switching units 202 the stable state of the initiator unit 395 will be such that the p-channel MOSFET 392 will be conducting and the n-channel MOSFET 391 will be in its non-conducting state A cycle of measurements of the switching device is begun by applying a low voltage pulse to input 231. This causes the LED in opto-coupler 394 to emit photons and saturate its phototransistor. This in turn forces MOSFET 391 into its non-conducting state and consequently MOSFET 392 becomes conductive. This state is maintained because of the latching action provided by opto-coupler 393. Current will flow from input 228 through its LED so saturating the phototransistor which maintains MOSFET 391 in non-conductance. In this manner the first lead unit 203 included in the initiator unit 395 is connected to the switching device and controls the current in it. The current path is made up of input 228, resistor 399, LED in opto-coupler 393, MOSFET 392 and the lead unit 203 associated with the initiator unit 395.

Consider now the state of capacitor 384 of the switching unit 202. In the inherently stable state where MOSFET 380 is conducting and MOSFET 381 is non-conducting this capacitor will be charged via the p-channel MOSFET of the preceding unit to a voltage approaching that applied to input 211. However, if the preceding switching unit is activated (or alternatively, if the switching unit 202 is the first switching unit and the initiator unit 395 is activated) then capacitor 384 will discharge through resistor 388, the n-channel MOSFET and lead unit 203 of the preceding unit. This capacitor will be the only one in the switching device which is not fully charged. When a low voltage pulse is applied to input 389, the LED of opto-coupler will emit photons and hence saturate the phototransistor. This will force all n-channel MOSFETs (corresponding to MOSFET 381 or MOSFET 392) to become momentarily conducting. However, capacitor 384 which had discharged will now charge up again. The current path will be through the p-channel MOSFET of the preceding unit, and through the LED of opto-coupler 386. The phototransistor of opto-coupler 386 will now saturate and in turn forces MOSFET 380 into its non-conducting state and MOSFET 381 into its conducting phase. Thus, the load unit 203 associated with this switching unit has now been connected to the current loop of the switching device. The current loop is made up of input 211, the p-channel MOSFET of the preceding unit, input 212, the LED of opto-coupler 386, diode 387, MOSFET 381 and the load unit 203. The load unit 203 of the preceding switching or initiating unit 202 or 395 is disconnected and deactivated when the pulse line 401 is pulled low. In this manner the load is transferred to successive switching units of the switching device. Because in this implementation the application of a low voltage pulse to input 396 forces the switching device to its original state there is no need for a special terminator unit.

This illustrates that the invention relates to the practical realization of a simple and reliable method of sequentially switching a number of loads into and out of a loop, which can be implemented with just three conductors but is not restricted to three conductors.

The load units 203 illustrated in FIG. 11 may, for example, be the same as the load units 6 described with reference to FIGS. 7a to 7c, 8a and 8b.

Figure 25A:
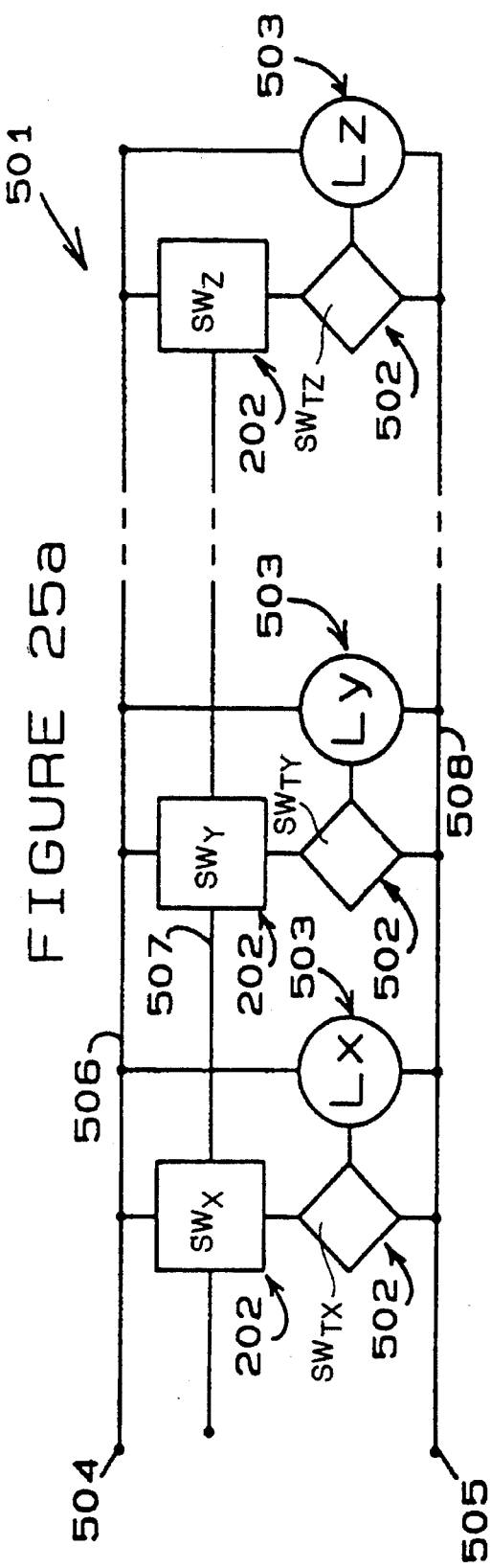
FIG. 25a is a block diagram of a third form of switching device according to the invention.

A third form of switching device 501 embodying the invention, as shown in FIG. 25a, includes a plurality of main switching units 202 (the first two of which are referenced X and Y and the last Z), a plurality of auxilliary switching units 502 (referenced Tx, Ty and Tz), a plurality of load units 503 (referenced Lx, Ly and Lz), an input contact 504 and an output contact 505. The main switching units 202 are connected in parallel with respect to one another, and with respect to loop power and loop return conductors 506 and 508, respectively. Adjacent main switching units 202 are also connected in series by a third conductor 507. Each auxiliary switching unit 502 is connected between an output of the main switching unit 202 and the conductor 508. Each load unit 503 is connected between its corresponding auxiliary switching unit 502 and the conductor 508. An input of each load unit 503 is connected to the respective auxiliary switching unit 502 and an output of the load unit 503 is connected to the output contact 505 via conductor 508. The input contact 504 is connected to each of the main and auxiliary switching units 202 and 502 via conductor 506.

The main switching units 202 are configured to operate in the same manner as the switching units of FIG. 11 except that the switching unit 202 selectively enables a corresponding auxiliary switching unit 502 which operates to activate the corresponding load unit 503 provided that the auxiliary switching unit 502 is enabled by the main switching unit 202 for a predetermined time. Thus after the predetermined duration, the activated auxiliary switching unit 502 connects the corresponding load unit 503 to conductor 506 to form a current loop from input terminal 504 to output terminal 505 via conductor 506, the switching unit 502, the load unit 503 and conductor 508. Each auxiliary switching device 502 is activated when an appropriate voltage pulse is applied to the input contact 504 and activates the main switching device 202 for a duration which exceeds a predetermined threshold duration associated with the auxiliary switching device.

Figure 26A:
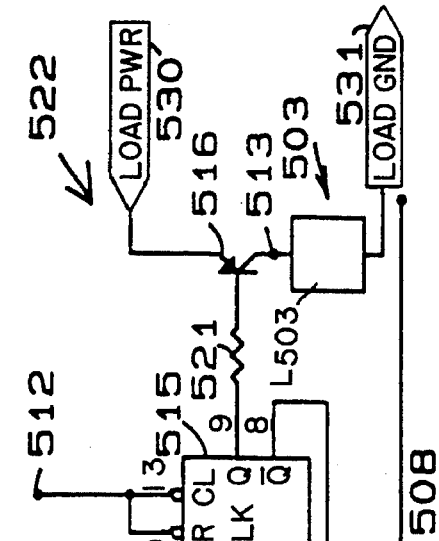
FIGS. 26a to 26c are circuit diagrams of three preferred embodiments of switching units which may be included in the third form of the switching device according to the invention.

An auxiliary switching unit 502 and associated load unit 503, as shown in FIG. 26a, includes inputs 511 and 512, a power output 513, a threshold device 514 shown, by way of example, as a programmable unijunction transistor (PUT), a bistable component 515 shown, by way of example, as a D-type flip-flop (such as a 74C74 integrated circuit), a switching component 516 shown as a PNP transistor, a capacitor 517 and resistors 518,519,520 and 521. The input 511 is connected to the output 215 of main switching unit 202 (see FIG. 13) and input 512 is connected to the power conductor 506. The PUT 514 is connected between input 511 and loop return conductor 508 in series with resistor 520 and the parallel arrangements of capacitor 517 and resistor 519 is connected in series with resistor 518 between input 511 and conductor 508, with the gate of PUT 514 connected to the junction between the resistor 518 and the parallel combination of capacitor 517 and resistor 519. The junction between the cathode of PUT 514 and resistor 520 is connected to the CLK input of flip-flop 515 which has its output connected via resistor 521 to the base of transistor 516. The emitter of transistor 516 is connected to input 512 and the collector of the transistor to the output 513. The load 503 is connected between the output 513 and the conductor 508.

In the absence of a voltage signal on input 511, there will be no charge on capacitor 517 because of the presence of the discharge resistor 519. Upon application of a voltage signal to input 511 by main switching unit 202, voltage will be applied to the anode of PUT 514 and the capacitor 517 will begin to charge through resistor 518 at a rate determined by the time constant associated with resistor 518 and capacitor 517. If and when the gate threshold voltage of PUT 514 is reached, PUT 514 will conduct and a positive voltage level will be applied to its cathode. The positive edge of this causes the flip-flop 515 to change its output state, thereby turning the transistor 516 on if it was previously off, or off if it was previously on, and activating or deactivating, respectively, the load 503. It will be appreciated that, if the voltage signal from the main switching unit 202 is applied to the input 511 for a time which is insufficient for the gate of PUT 514 to reach its threshold voltage, then the load 503 will not change its existing state. In this embodiment of the invention, therefore, whether or not the load is toggled from one state to the other depends on the length of time for which the voltage signal is applied to the input 511. In a preferred practical implementation of the invention, the current in the loop is monitored while the voltage signal is applied to the conductor 506. In this way, the sudden increase in current caused by PUT 514 conduct&rig will be detected and will be positive confirmation that the status of the load 503 has been toggled. The PUT 514 could of course be replaced by any other suitable device, such as a unijunction transistor, which changes its state at a predetermined threshold level.

Figure 25B:
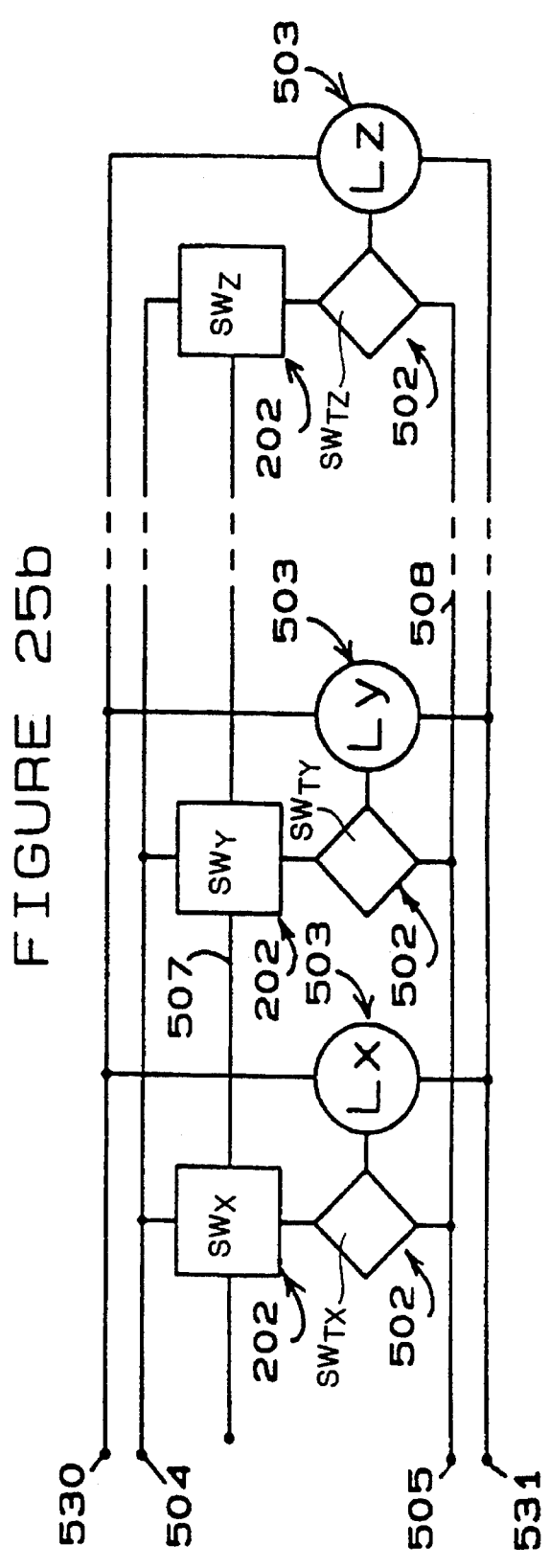
FIG. 25b is a block diagram of a modified version of the third form of switching device.
Figure 26B:
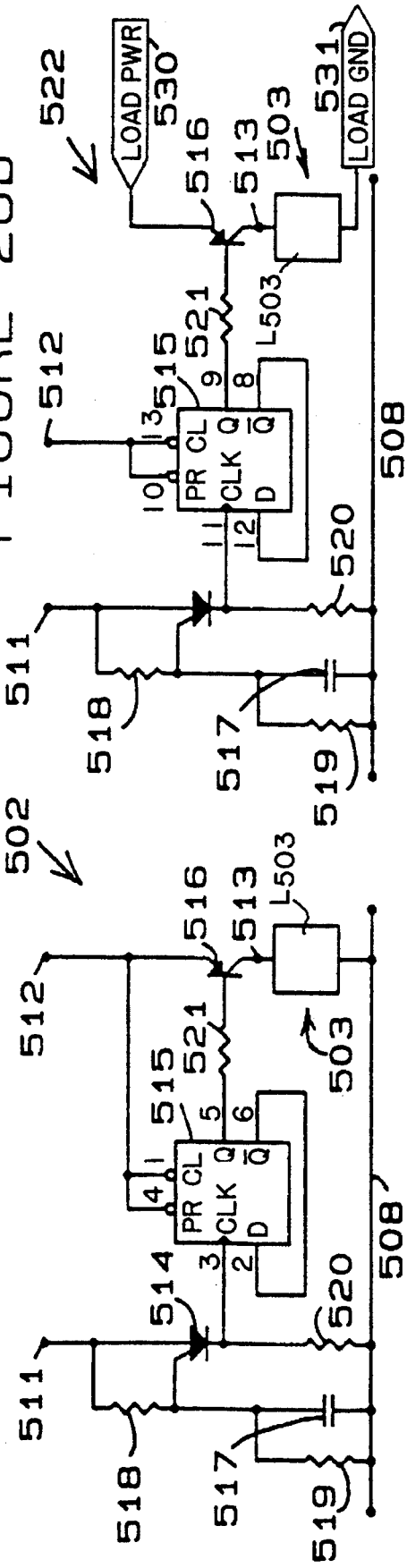

If the load 503 is powered from the loop as shown in FIG. 25a and 26a, then there will be a variable "background" current on the loop depending on whether or not the load is turned on or off. FIG. 25b shows a switching device like that of FIG. 25a, but in which the loads 503 have their own independent power supply supplied on conductors 530, 531 and the auxiliary switching units 502 are arranged to connect the loads 503 to conductor 530. FIG. 26b shows a switching unit 522 which is a variant of the switching unit 502 of FIG. 26a. In this embodiment, which is otherwise identical to unit 502, the current in the loop will be independent of the state of load 503. The bistable device 515 can either be powered from the loop itself as shown in FIG. 26a, or from the load power supply. Assuming the device 515 is a CMOS, the current consumed by this device will be less than 1 µA and this amount of "background" current in the loop can usually be ignored or accounted for.

When power is first applied to the flip-flop 515 in the switching units 502 of FIG. 26a and 522 of FIG. 26b, the state of the Q output may be indeterminate and it may not be known whether the associated load 503 is active or inactive.

Figure 26C:
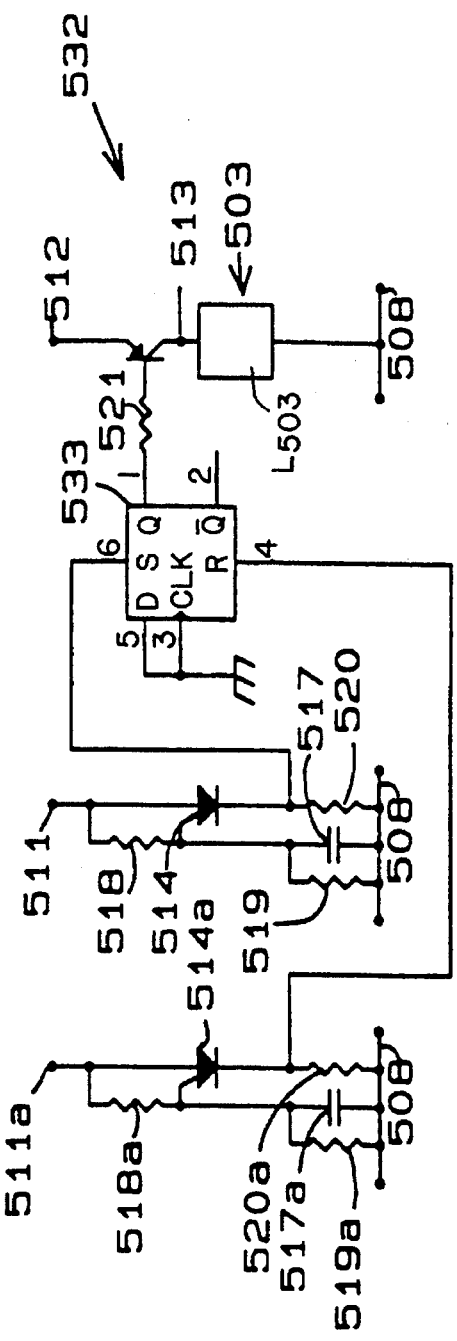

FIG. 26c shows a further embodiment of switching unit 532 in which the state of the load 503 can be definitely known. In the unit 532 the D-type flip-flop of unit 502 is replaced by a D-type flip-flop 533 such as 4013 integrated circuit, which changes its Q output to a known state in response to particular inputs to its set and reset inputs. The unit 532 also comprises a further threshold arrangement connected between a further input 511a and a corresponding switching unit 202 (see FIG. 13) and the conductor 508, such further threshold arrangement comprising a PUT 514a, a capacitor 517a and resistors 518a, 519a and 520a. The output of the PUT 514 is connected to the set input of the flip-flop 533 and the output of the other PUT 514a is connected to the reset input of the flip-flop 533. Thus, applying a voltage signal to input 511. For sufficient time to enable PUT 514 to conduct will cause the load 503 to be switched on and applying a voltage signal to input 511a for sufficient time to enable PUT 514a to conduct will cause the load 503 to be switch off. The status of the load will thus always be known.

Figure 27:
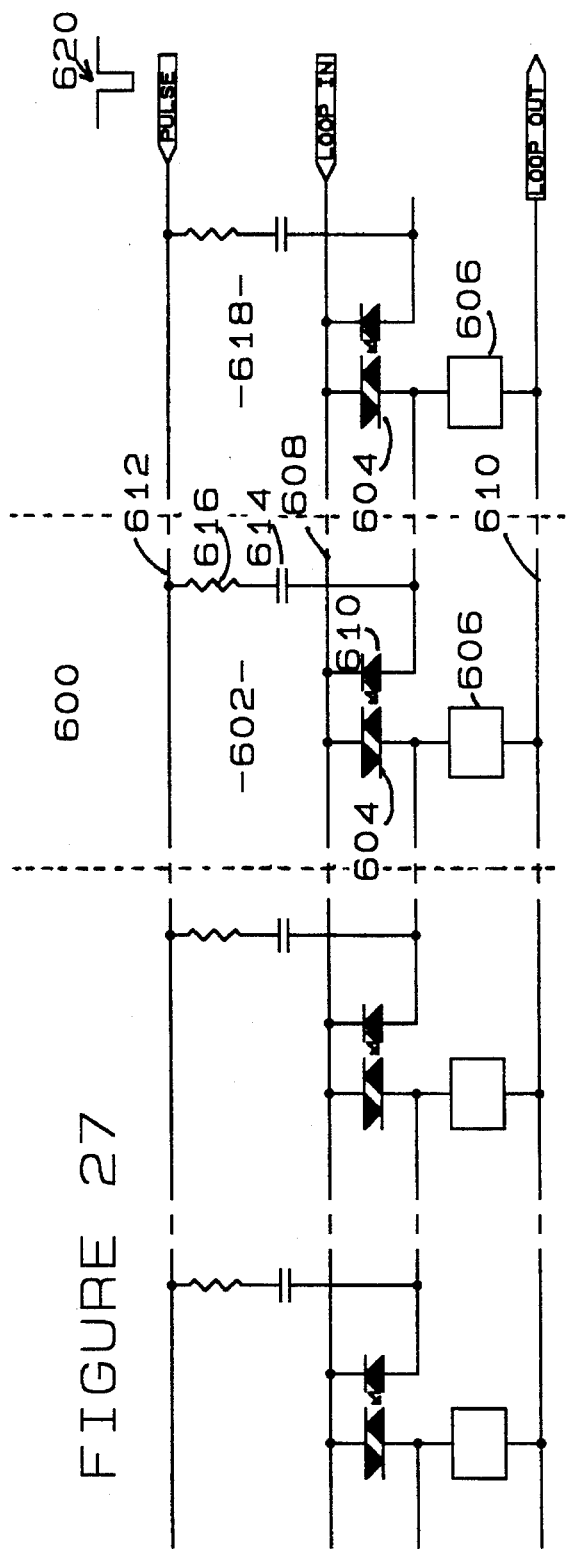
FIGS. 27 and 28 are circuit diagrams of preferred embodiments which are four conductor versions of the preferred embodiments illustrated in FIGS. 19 and 22.
Figure 28:
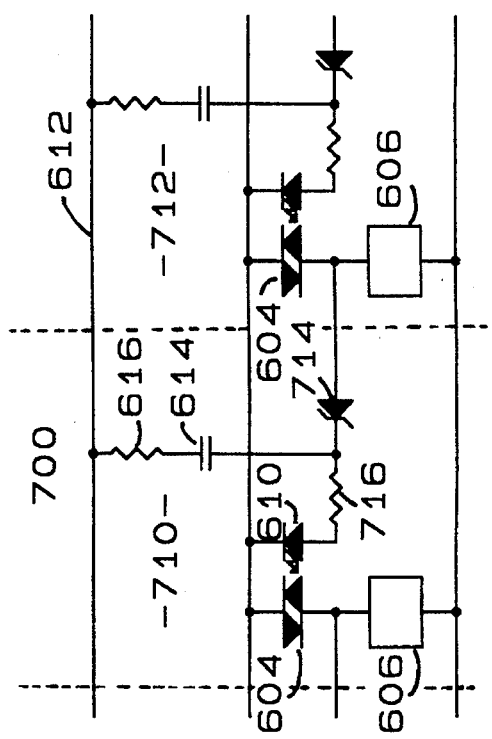

Two four conductor versions of the switching devices of FIGS. 19 and 22 are illustrated in FIGS. 27 and 28, one being a low current device 600 and the other being a high current device 700. A switching unit 602 of the low current device 600 includes an optically coupled triac 604 connected to a respective load unit 606 of the unit 602. The triac 604 and the load unit 606 are connected between a loop power conductor 608 and a loop return conductor 610. The triac 604 supplies current to the load unit 606 when it is triggered by a LED 610 of the unit 602. The LED 610 has its cathode connected to the loop power conductor 608 and its anode connected to a pulse conductor 612 via a capacitor 614 and a resistor 616. The anode of the LED 610 is also connected to the node between the triac 604 and the load unit 606 of the preceding switching unit 618. The pulse conductor 612 is initially held at the same voltage as the power conductor 608, or at a voltage positive with respect to the network conductor 610, and all of the triacs 604 are deactivated. The capacitors 614 therefore all charge up to the voltage of the pulse conductor 612. The switching units 602, 618 of the device 600 are sequentially activated by applying a pulse 620 to the pulse conductor 612 so as to pull the conductor 612 low. Assuming the preceding switching unit 618 has been activated, the triac 604 of the unit 618 is on and the capacitor 614 of the succeeding unit 602 is allowed to discharge via the current path through the respective load 606 of the preceding unit 618. Only the capacitor 614 following an activated switching unit 618 is discharged so that it is only this capacitor which begins charging, via the activated triac 604, on application of the pulse 620 to place the pulse conductor 612 in a low state. The capacitor 614 is charged whilst the pulse conductor 612 is low and on the pulse conductor 612 returning to its original voltage the capacitor acquires a voltage which reverse biases and deactivates the triac 604 of the preceding unit 618. The capacitor 614 then discharges via the LED 610 which produces a current through the LED 610 sufficient to trigger the triac 604 of the unit 602, thereby activating the succeeding load unit 606. For load units 606 which require a current greater than about 5 milliamps, the switching unit 602 needs to be modified to the high current unit 710, as shown in FIG. 28. A Zenor diode 714 is placed between the capacitor 614 and the triac 604 of the preceding switching unit 612 with the cathode of the Zenor diode 714 connected to the capacitor 614. A resistor 716 is included between the diode 610 and the capacitor 614. Zenor diode 714 and the resistor 716 ensure the current discharged from the capacitor 614 is shared by the paths through the load 606 of the preceding unit 712 and the diode 610 so that there is sufficient current supplied to positively trigger the triac 604 of the unit 710, which must meet the current demands of the load unit 606 connected to the unit 710.

I claim:

1. A switching device comprising:

a plurality of switching means connected serially to one another and having at least a first one of said switching means connected to an input terminal; and a plurality of load means connected in parallel, each between a corresponding switching means of said plurality of switching means, and a common output terminal which receives current signals from said plurality of load means;

said plurality of switching means each having a first state in which the corresponding load means is deactivated and inhibited from providing a respective current signal, and a second state in which the corresponding load means is activated to provide said respective current signal, said second state being adopted on the application of a trigger signal to said input terminal when, except for the first switching means, the preceding switching means is in said second state, a subsequent application of said trigger signal causing the switching means to revert to said first state;

wherein, on placing the first switching means in said second state and the remaining switching means in said first state, sequentially applying said trigger signal causes said plurality of switching means to sequentially adopt said second state and then subsequently revert to said first state.

2. A switching device as claimed in claim 1, wherein said trigger signal comprises a change in the level of an input signal applied to said input terminal.

3. A switching device according to claim 1, wherein said current signal is representative of a predetermined parameter measured by said corresponding load means when activated.

4. A switching device according to claim 2, in which said trigger signal is a voltage signal.

5. A switching device according to claim 4, in which adjacent switching means are connected to one another by a single conductor.

6. A switching device according to claim 5, in which each said switching means activates the corresponding load means when a predetermined voltage is applied across the corresponding switching means.

7. A switching device according to claim 6, in which each said switching means includes first, second and third terminals and is arranged so that, when the voltage at said first terminal is at a first level, a signal path is provided to said third terminal from said first terminal and, when the voltage is at a second level, a signal path is provided to said second terminal from said first terminal.

8. A switching device according to claim 7, in which each said switching means further includes a threshold switching component connected between said first terminal and said second terminal, a breakdown component connected between said first terminal and a gate input of said switching component and a resistance connected between said second terminal and said gate input of said switching component.

9. A switching device according to claim 8, in which said breakdown component is a zener diode having its cathode connected to said first terminal and its anode connected to said gate input of said threshold switching component.

10. A switching device according to claim 9, in which said threshold switching component is a silicon controlled rectifier having its cathode connected to said second terminal and its anode coupled to said first terminal.

11. A switching device according to claims 8, 9 or 10, in which a normally closed switch which is opened upon switching of said threshold switching component is connected between said first terminal and said third terminal.

12. A switching device according to any one of claims 1, 2, 3 and 4 in which said trigger signal is a voltage pulse.

13. A switching device according to claim 12, in which said switching means are activated in response to the voltage of said pulse.

14. A switching device according to claim 12, in which said switching means are activated in response to an edge of said pulse.

15. A switching device according to claim 12, wherein there are n switching means and in order to activate the nth switching means, n voltage pulses need to be applied to said input terminal, n being a positive integer.

16. A switching device according to claim 15, in which said load means are connected to said output terminal by a loop return conductor and, in response to said trigger signal, an activation signal is passed between adjacent switching means by a connecting conductor which connects said adjacent switching means.

17. A switching device according to claim 16, in which said switching means are connected to said input terminal by a loop power conductor.

18. A switching device according to claim 16, in which said input terminal is connected to said switching means by a pulse conductor and a loop power conductor is connected to another input terminal which is connected to a constant voltage power supply.

19. A switching device as claimed in any one of claims 1, 2, 3 and 4 wherein the load means are activated in response to the duration the corresponding switching means is in said second state.

20. A switching device according to claim 1, in which said load means each include an auxiliary switching means operative to activate a respective load if said auxiliary switching means is activated by said corresponding switching means for a predetermined duration.

21. A switching device according to claim 2, in which each said auxiliary switching means activates said respective load when a predetermined voltage is applied across said auxiliary switching means for said predetermined duration.

22. A switching device according to claim 21, in which each auxiliary switching means includes first, second and third terminals and is arranged so that, when the voltage at said first terminal is at a predetermined level for a predetermined time a signal path is provided to said second terminal from said first terminal to cause a change of voltage at said third terminal.

23. A switching device according to claim 22, in which said auxiliary switching means further includes a threshold switching component having an input connected to said first terminal and an output connected to said second terminal via a resistor, and a bistable component having an input connected to the output of said threshold switching device and an output connected to said third terminal.

24. A switching device according to claim 23, in which said auxiliary switching component is a programmable unijunction transistor having its anode connected to said first terminal, its cathode connected to said second terminal and its gate connected to receive a gate voltage from a time constant circuit connected between said first and second terminals.

25. A switching device according to claim 24, in which said time constant circuit comprises a first resistor connected in series with the parallel combination of a second resistor and capacitor between said first and second terminals, said gate of said programmable unijunction transistor being connected to the junction between said first resistor and said series combination of said second resistor and said capacitor.

26. A switching device according to any one of claims 23 to 25, in which said third terminal is connected to said first terminal by a load switching component controlled by said output of said bistable component.

27. A switching device according to claim 26, in which said load switching component is a transistor having its base connected to said output of said bistable component.

28. A switching device according to claim 27, in which said bistable component is a D-type flip-flop having its clock input connected to said output of said threshold switching component and its Q output connected to said third terminal.

29. A switching device according to claim 28, including a second threshold switching component having an input connected to said first terminal and an output connected to said second terminal via a resistor, said output of said second threshold switching component being connected to a second input of said bistable component.

30. A switching device according to claim 28, in which said bistable component is a D-type flip-flop having its set input connected to the output of said first threshold switching device, its reset input connected to the output of said second threshold switching device and its Q output connected to said third terminal.

31. A switching device according to any one of claims 1, 2, 3 and 4 wherein said load means are sensors.

32. A switching device as claimed in claim 1, wherein said status signal indicates a predetermined action has occurred.

33. A switch device according to any one of claims 1, 2, 10 and 32, wherein said load means are actuators.

* * * * *